US010763268B2

(12) United States Patent
Yoon

(10) Patent No.: US 10,763,268 B2
(45) Date of Patent: Sep. 1, 2020

(54) SEMICONDUCTOR DEVICES AND METHODS FOR MANUFACTURING THE SAME

(71) Applicant: Samsung Electronics Co., Ltd., Suwon-si, Gyeonggi-do (KR)

(72) Inventor: Changseop Yoon, Yangsan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/437,914

(22) Filed: Jun. 11, 2019

(65) Prior Publication Data

US 2019/0296027 A1    Sep. 26, 2019

Related U.S. Application Data

(63) Continuation of application No. 15/821,230, filed on Nov. 22, 2017, now Pat. No. 10,366,997, which is a continuation of application No. 15/086,660, filed on Mar. 31, 2016, now abandoned.

(30) Foreign Application Priority Data

Apr. 1, 2015    (KR) .......................... 10-2015-0046293

(51) Int. Cl.
   *H01L 27/11*        (2006.01)
(52) U.S. Cl.
   CPC .............................. *H01L 27/1104* (2013.01)
(58) Field of Classification Search
   None
   See application file for complete search history.

(56) References Cited

U.S. PATENT DOCUMENTS

| 7,091,538 B2 | 8/2006 | Natori et al. |
| 7,339,218 B2 | 3/2008 | Hidaka et al. |
| 7,518,196 B2 | 4/2009 | Chau et al. |
| 7,910,994 B2 | 3/2011 | Yu et al. |
| 8,492,230 B2 | 7/2013 | Ishikawa et al. |
| 8,791,509 B2 | 7/2014 | Beyer et al. |
| 9,105,691 B2 | 8/2015 | Cheng et al. |
| 2001/0009805 A1 | 7/2001 | Ha et al. |
| 2003/0100177 A1 | 5/2003 | Takewaka et al. |
| 2005/0110062 A1 | 5/2005 | Natori et al. |
| 2005/0118795 A1 | 6/2005 | Hidaka et al. |
| 2006/0186484 A1 | 8/2006 | Chau et al. |

(Continued)

FOREIGN PATENT DOCUMENTS

| JP | H0685080 | 3/1995 |
| JP | H0831932 | 2/1996 |

(Continued)

*Primary Examiner* — Moazzam Hossain
*Assistant Examiner* — Stanetta D Isaac
(74) *Attorney, Agent, or Firm* — Myers Bigel, P.A.

(57) ABSTRACT

A semiconductor device includes a substrate including first and second active patterns thereon, a first gate electrode intersecting the first and second active patterns, first and second source/drain regions on the first and second active patterns, respectively, at one side of the first gate electrode, and an active contact on the first source/drain region so as to be electrically connected to the first source/drain region. The active contact includes a first sub-contact and a second sub-contact. The second sub-contact includes a vertical extension vertically extending toward the substrate. A bottom surface of the vertical extension is lower than a bottom surface of the first sub-contact.

20 Claims, 19 Drawing Sheets

(56) References Cited

U.S. PATENT DOCUMENTS

| | | |
|---|---|---|
| 2009/0096002 A1 | 4/2009 | Yu et al. |
| 2010/0133614 A1 | 6/2010 | Beyer et al. |
| 2011/0049629 A1 | 3/2011 | Ishikawa et al. |
| 2014/0302661 A1 | 10/2014 | Cheng et al. |

FOREIGN PATENT DOCUMENTS

| | | |
|---|---|---|
| JP | 2001332634 | 11/2001 |
| KR | 1019990024572 | 4/1999 |

SEMICONDUCTOR DEVICES AND METHODS FOR MANUFACTURING THE SAME

CROSS-REFERENCE TO RELATED APPLICATIONS

This U.S. non-provisional patent application is a continuation of U.S. patent application Ser. No. 15/821,230, filed Nov. 22, 2017, which is a continuation of U.S. patent application Ser. No. 15/086,660, filed Mar. 31, 2016, which itself claims priority under 35 U.S.C. § 119 to Korean Patent Application No. 10-2015-0046293, filed on Apr. 1, 2015, in the Korean Intellectual Property Office, the disclosures of which are hereby incorporated by reference in their entireties.

BACKGROUND

The inventive concepts relate to semiconductor devices and methods for manufacturing the same. More particularly, the inventive concepts relate to semiconductor devices including field effect transistors and methods for manufacturing the same.

Semiconductor devices may be attractive in the electronics industry because of their small sizes, multi-functional characteristics, and/or relatively low manufacture costs. Semiconductor devices may be categorized as memory devices for storing logical data, logic devices for processing logical data, and hybrid semiconductor devices having the functionalities of both the memory devices and the logic devices. Semiconductor devices with excellent characteristics may be increasingly demanded with the development of the electronics industry. For example, high-reliability, high-speed, and/or multi-functional semiconductor devices may be increasingly demanded. To satisfy these demands, structures in semiconductor devices may become more complex and semiconductor devices may become more highly integrated.

SUMMARY

Embodiments of the inventive concepts may provide semiconductor devices including an active contact, which is capable of improving reliability.

Embodiments of the inventive concepts may also provide methods for manufacturing semiconductor devices with improved reliability by a less complex process.

According to some embodiments, a semiconductor device includes a substrate including active patterns extending in parallel thereon; a gate electrode extending across the active patterns; respective source/drain regions in the active patterns at opposite sides of the gate electrode; and respective active contacts on and electrically contacting the respective source/drain regions. At least one of the respective active contacts includes a first sub-contact extending on a corresponding one of the respective source/drain regions opposite the substrate, and a second sub-contact extending toward the substrate beyond the first sub-contact and between adjacent ones of the active patterns. The second sub-contact is separated from the adjacent ones of the active patterns by an insulating material.

In some embodiments, the semiconductor device may further include respective conductive connection patterns between the respective source/drain regions and the respective active contacts thereon. The respective conductive connection patterns and the respective active contacts may include different materials. The second sub-contact of the at least one of the respective active contacts may extend towards the substrate between ones of the respective conductive connection patterns on the adjacent ones of the active patterns and may be separated from sidewalls of the ones of the respective conductive connection patterns by the insulating material.

In some embodiments, respective upper surfaces of the first and second sub-contacts opposite the substrate may be coplanar, and the first and second sub-contacts of the at least one of the respective active contacts may define a unitary member.

In some embodiments, the semiconductor device may further include device isolation layers on the substrate between the active patterns. The insulating material may be an interlayer insulating layer on the device isolation layers. The second sub-contact of the at least one of the respective active contacts may extend towards the substrate beyond a surface of the gate electrode and into the interlayer insulating layer but may be confined above the device isolation layers, and the first sub-contact of the at least one of the respective active contacts may be confined above the surface of the gate electrode.

In some embodiments, the semiconductor device may further include a conductive via on the respective upper surfaces of the first and/or second sub-contacts of the at least one of the respective active contacts. The via may be between ones of the active patterns in plan view. A conductive line on the conductive via may be electrically connected to the at least one of the respective active contacts thereby.

In some embodiments, the respective active contacts may have coplanar surfaces. Another of the respective active contacts may include the first sub-contact extending on a corresponding one of the respective source/drain regions opposite the substrate, but may be free of the second sub-contact extending toward the substrate beyond the first sub-contact and between adjacent ones of the active patterns.

In some embodiments, the first sub-contact of the at least one of the respective active contacts may extend in a different direction than the second sub-contact thereof to increase a contact area thereof. For example, the first sub-contact of the at least one of the respective active contacts may extend parallel to the gate electrode, and the second sub-contact of the at least one of the respective active contacts may extend perpendicular to the gate electrode and parallel to the active patterns.

In one aspect, a semiconductor device may include a substrate including first and second active patterns formed thereon, the first and second active patterns extending in a first direction parallel to a top surface of the substrate, a first gate electrode intersecting the first and second active patterns and extending in a second direction intersecting the first direction, first and second source/drain regions respectively provided in upper portions of the first and second active patterns at one side of the first gate electrode, the first and second source/drain regions spaced apart from each other in the second direction, and an active contact disposed on the first source/drain region so as to be electrically connected to the first source/drain region. The active contact may include a first sub-contact overlapping with the first source/drain region in plan view, and a second sub-contact provided between the first and second source/drain regions in plan view. The second sub-contact may include a vertical extension vertically extending toward the substrate, and a bottom surface of the vertical extension may be lower than a bottom surface of the first sub-contact.

In an embodiment, the semiconductor device may further include device isolation layers disposed in the substrate to define the first and second active patterns, and an interlayer insulating layer covering the first and second source/drain regions and sidewalls of the first gate electrode. The bottom surface of the vertical extension may be disposed at a level between a top surface of the interlayer insulating layer and top surfaces of the device isolation layers.

In an embodiment, a top surface of the second sub-contact may be substantially coplanar with a top surface of the first sub-contact.

In an embodiment, the first sub-contact and the second sub-contact may include the same material and may be connected to each other to constitute one body.

In an embodiment, the vertical extension may overlap with the first sub-contact in plan view.

In an embodiment, the top surface of the interlayer insulating layer may be substantially coplanar with a top surface of the first gate electrode.

In an embodiment, the semiconductor device may further include first and second conductive connection patterns provided on the first and second source/drain regions so as to be connected to the first and second source/drain regions, respectively. The first sub-contact may be disposed on a top surface of the first conductive connection pattern so as to be electrically connected to the first source/drain region through the first conductive connection pattern, and the second sub-contact may be provided between the first and second conductive connection patterns.

In an embodiment, the semiconductor device may further include a barrier layer surrounding sidewalls and a bottom surface of the active contact. A portion of the barrier layer may be disposed between the first sub-contact and the first conductive connection pattern.

In an embodiment, the semiconductor device may further include a second gate electrode intersecting the first and second active patterns and extending in parallel to the first gate electrode. The first and second gate electrodes may be spaced apart from each other in the first direction, and the active contact may be provided between the first and second gate electrodes in plan view.

In an embodiment, the semiconductor device may further include a capping layer covering top surfaces of the first and second gate electrodes in common. The bottom surface of the vertical extension may be lower than a bottom surface of the capping layer.

In an embodiment, the semiconductor device may further include a via provided on the active contact, and a conductive line provided on the via so as to be electrically connected to the first source/drain region through the via and the active contact.

In an embodiment, the active contact may have a T-shape when viewed from a cross-sectional view taken along the first direction.

In an embodiment, one sidewall of the second sub-contact, which is adjacent to the vertical extension, may have a stepped profile when viewed from a cross-sectional view taken along the second direction.

In an embodiment, the first sub-contact may have a first sidewall, and the second sub-contact may have a second sidewall adjacent to the first sidewall. The first sidewall and the second sidewall may be coplanar with each other.

In an embodiment, the first sub-contact may extend in the second direction to penetrate the second sub-contact in plan view.

In another aspect, a semiconductor device may include a substrate, device isolation layers provided in the substrate to define active patterns, the active patterns including upper portions protruding from top surfaces of the device isolation layers, a source/drain region provide in the upper portion of at least one of the active patterns, a conductive connection pattern provided on the source/drain region so as to be connected to the source/drain region, an active contact provided on the conductive connection pattern so as to be electrically connected to the source/drain region, the active contact including a first sub-contact connected to a top surface of the conductive connection pattern and a second sub-contact connected to the first sub-contact in one body, a via provided on the active contact, and a conductive line provided on the via so as to be electrically connected to the source/drain region through the via and the active contact.

In an embodiment, the second sub-contact may include a vertical extension vertically extending toward the substrate, and the vertical extension may overlap with the first sub-contact in plan view.

In an embodiment, a bottom surface of the vertical extension may be lower than a bottom surface of the first sub-contact.

In an embodiment, the semiconductor device may further include a barrier layer surrounding the active contact. A portion of the barrier layer may be disposed between the first sub-contact and the conductive connection pattern.

In an embodiment, the semiconductor device may further include first and second gate electrodes spaced apart from each other with the source/drain region interposed therebetween. The first and second gate electrodes may extend in parallel to each other to intersect the active patterns. The active contact may be disposed between the first and second gate electrodes in plan view, and the active contact may be spaced apart from all of the first and second gate electrodes.

In an embodiment, the semiconductor device may further include a capping layer covering top surfaces of the first and second gate electrodes in common. The second sub-contact may penetrate the capping layer.

In still another aspect, a semiconductor device may include a substrate, device isolation layers disposed in the substrate to define active patterns, the active patterns including upper portions protruding from top surfaces of the device isolation layers, a gate electrode intersecting the active patterns, a source/drain region provided in the upper portion of at least one of the active patterns, the source/drain region adjacent to the gate electrode, and an active contact disposed on the source/drain region so as to be electrically connected to the source/drain region. The active contact may be spaced apart from the gate electrode, and the active contact may include a vertical extension having a bottom surface lower than a top surface of the gate electrode.

In an embodiment, the active contact may include a first sub-contact overlapping with the source/drain region in plan view, and a second sub-contact connected to the first sub-contact in one body. A portion of the second sub-contact, which vertically extends toward the substrate, may correspond to the vertical extension.

In an embodiment, the vertical extension may overlap with the first sub-contact in plan view.

In yet another aspect, a method for manufacturing a semiconductor device may include forming first and second active patterns on a substrate, forming first and second gate electrodes extending in parallel to each other to intersect the first and second active patterns, forming first and second source/drain regions in upper portions of the first and second active patterns between the first and second gate electrodes, respectively, forming at least one interlayer insulating layer covering the first and second gate electrodes and the first and second source/drain regions, forming a first sub-contact hole overlapping with the first source/drain region in a plan view by patterning the at least one interlayer insulating layer, forming a second sub-contact hole between the first and second source/drain regions in a plan view by patterning the at least one interlayer insulating layer, the first and second sub-contact holes connected to each other to constitute one communicating hole, and forming an active contact filling the communicating hole. Forming the second sub-contact hole may include forming a vertical extension hole vertically extending from a portion of a bottom surface of the first sub-contact hole toward the substrate.

In an embodiment, a first layout defining a position of the first sub-contact hole may be provided to partially overlap with a second layout defining a position of the second sub-contact hole, and the vertical extension hole may be formed in an overlapping region of the first and second layouts.

In an embodiment, the method may further include patterning the at least one interlayer insulating layer to form a gate contact hole exposing a top surface of at least one of the first and second gate electrodes. The gate contact hole may be formed simultaneously with the second sub-contact hole.

In an embodiment, the method may further include forming first and second conductive connection patterns connected to the first and second source/drain regions, respectively. At least one of the interlayer insulating layers may be formed to cover the first and second conductive connection patterns, and the first sub-contact hole may expose a top surface of the first conductive connection pattern.

BRIEF DESCRIPTION OF THE DRAWINGS

The inventive concepts will become more apparent in view of the attached drawings and accompanying detailed description.

DETAILED DESCRIPTION OF EMBODIMENTS

Figure 1:
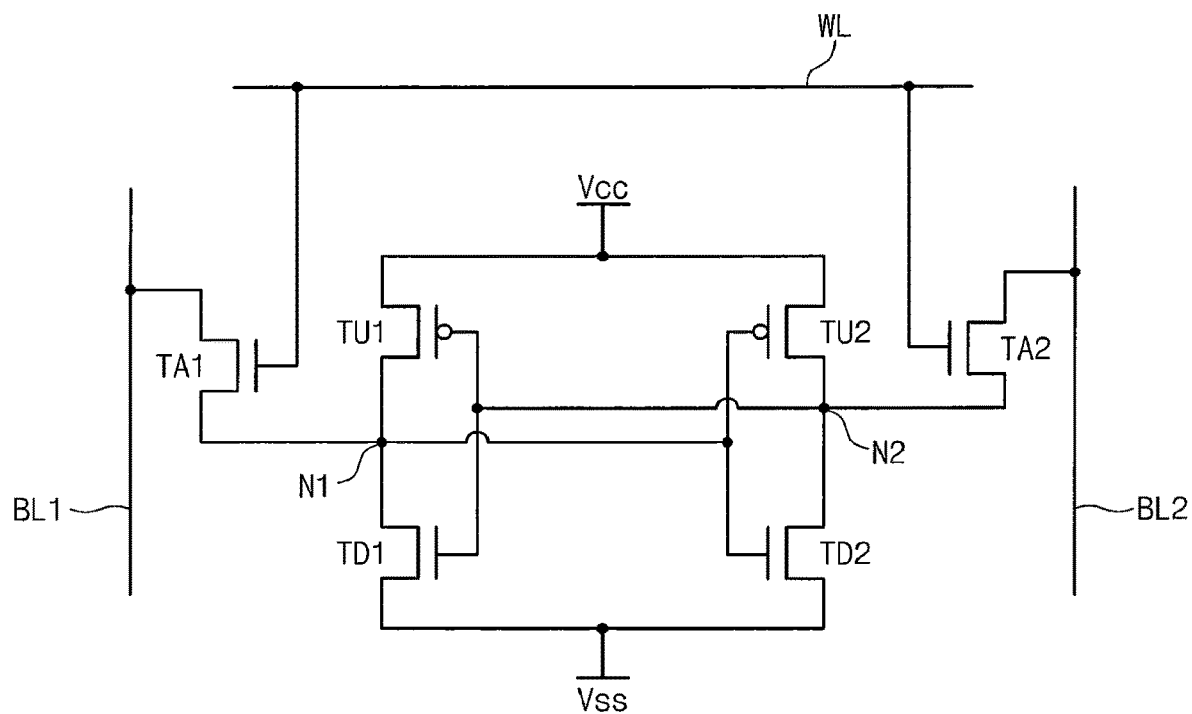
FIG. 1 is an equivalent circuit diagram illustrating a static random access memory (SRAM) cell according to example embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items.

It will be understood that when an element is referred to as being "connected" or "coupled" to another element, it may be directly connected or coupled to the other element or intervening elements may be present. Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Additionally, embodiments in the detailed description will be described with sectional views as ideal exemplary views of the inventive concepts. Accordingly, shapes of the exemplary views may be modified according to manufacturing techniques and/or allowable errors. Therefore, embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is an equivalent circuit diagram illustrating a static random access memory (SRAM) cell according to example embodiments of the inventive concepts.

Referring to FIG. 1, a SRAM cell according to embodiments of the inventive concepts may include a first pull-up transistor TU1, a first pull-down transistor TD1, a second pull-up transistor TU2, a second pull-down transistor TD2, a first access transistor TA1, and a second access transistor TA2. The first and second pull-up transistors TU1 and TU2 may be P-type metal-oxide-semiconductor (PMOS) transistors, but the first and second pull-down transistors TD1 and TD2 and the first and second access transistors TA1 and TA2 may be N-type MOS (NMOS) transistors.

A first source/drain of the first pull-up transistor TU1 and a first source/drain of the first pull-down transistor TD1 may be connected to a first node N1. A second source/drain of the first pull-up transistor TU1 may be connected to a power line Vcc, and a second source/drain of the first pull-down transistor TD1 may be connected to a ground line Vss. A gate of the first pull-up transistor TU1 may be electrically connected to a gate of the first pull-down transistor TD1. Thus, the first pull-up transistor TU1 and the first pull-down transistor TD1 may define a first inverter. The gates of the first pull-up and first pull-down transistors TU1 and TD1, which are connected to each other, may correspond to an input terminal of the first inverter. The first node N1 may correspond to an output terminal of the first inverter.

A first source/drain of the second pull-up transistor TU2 and a first source/drain of the second pull-down transistor TD2 may be connected to a second node N2. A second source/drain of the second pull-up transistor TU2 may be connected to the power line Vcc, and a second source/drain of the second pull-down transistor TD2 may be connected to the ground line Vss. A gate of the second pull-up transistor TU2 may be electrically connected to a gate of the second pull-down transistor TD2. Thus, the second pull-up transistor TU2 and the second pull-down transistor TD2 may define a second inverter. The gates of the second pull-up and second pull-down transistors TU2 and TD2, which are connected to each other, may correspond to an input terminal of the second inverter. The second node N2 may correspond to an output terminal of the second inverter.

The first and second inverters may be combined with each other to define a latch structure. In other words, the gates of the first pull-up and first pull-down transistors TU1 and TD1 may be electrically connected to the second node N2, and the gates of the second pull-up and second pull-down transistors TU2 and TD2 may be electrically connected to the first node N1. A first source/drain of the first access transistor TA1 may be connected to the first node N1, and a second source/drain of the first access transistor TA1 may be connected to a first bit line BL1. A first source/drain of the second access transistor TA2 may be connected to the second node N2, and a second source/drain of the second access transistor TA2 may be connected to a second bit line BL2. Gates of the first and second access transistors TA1 and TA2 may be electrically connected to a word line WL. As a result, the SRAM cell according to embodiments of the inventive concepts may be realized.

[Semiconductor Device]

Figure 2:
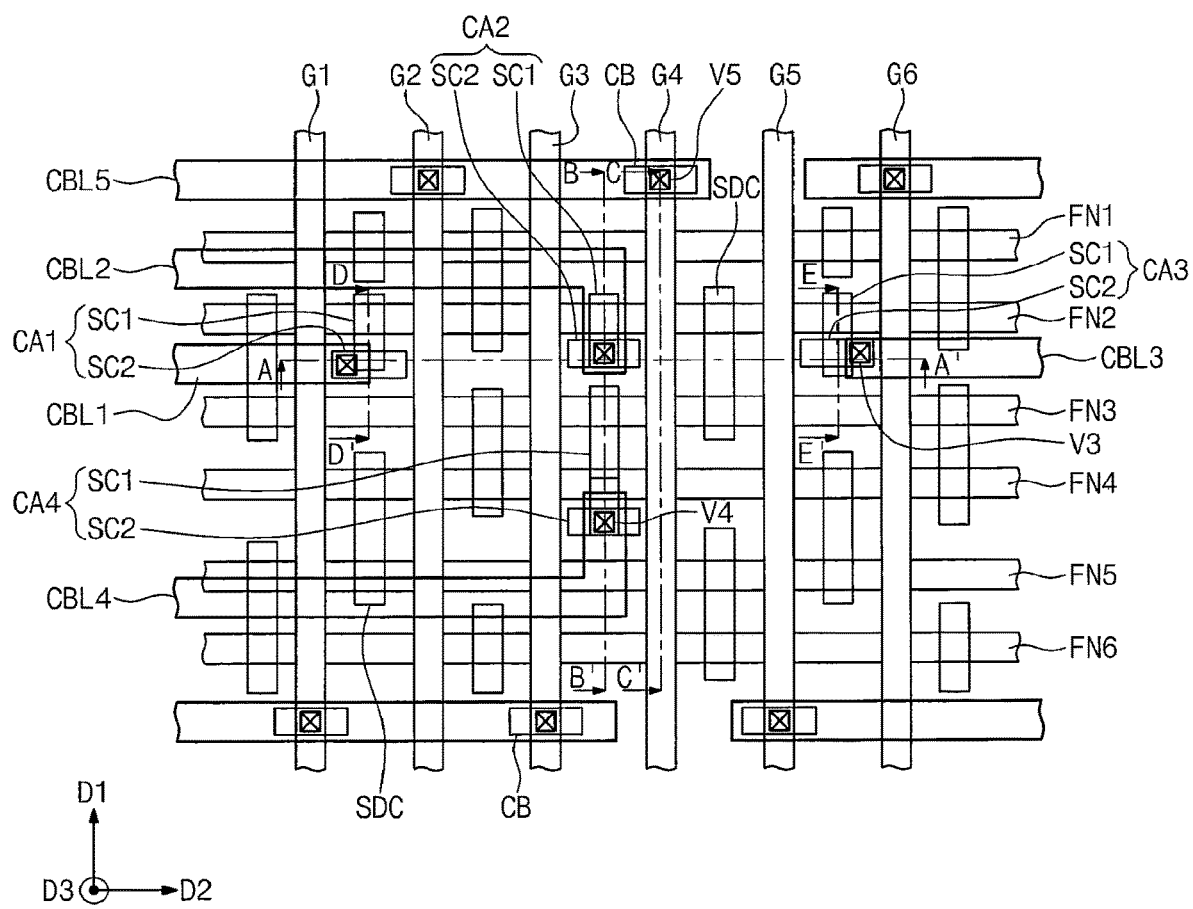
FIG. 2 is a plan view illustrating semiconductor devices according to example embodiments of the inventive concepts.

FIG. 2 is a plan view illustrating semiconductor devices according to example embodiments of the inventive concepts. FIGS. 3A, 3B, 3C, 3D, and 3E are cross-sectional views taken along lines A-A', B-B', C-C', D-D', and E-E' of FIG. 2, respectively.

Referring to FIGS. 2 and 3A to 3E, a first device isolation layer ST1 may be provided in a substrate 100 to define logic cells. FIG. 2 illustrates one of the logic cells. The logic cell may correspond to a unit for performing a logic function. For example, the logic cell may include the SRAM cell described with reference to FIG. 1. For example, the substrate 100 may be a silicon substrate, a germanium substrate, or a silicon-on-insulator (SOI) substrate.

Second device isolation layers ST2 may be provided in a substrate 100 to define active patterns FN1 to FN6. The active patterns FN1 to FN6 may include first to sixth active patterns FN1 to FN6 extending in a second direction D2 parallel to a top surface of the substrate 100. The active patterns FN1 to FN6 may be arranged in a first direction D1 intersecting the second direction D2. The first direction D1 may be parallel to the top surface of the substrate 100. The second device isolation layers ST2 extending in the second direction D2 may be disposed at both sides of each of the active patterns FN1 to FN6. In some embodiments, upper portions of the active patterns FN1 to FN6 may include fin portions, respectively. The fin portions may have fin shapes protruding from between the second device isolation layers ST2.

In some embodiments, each of the active patterns FN1 to FN6 may define a P-type metal-oxide-semiconductor field effect transistor (PMOSFET) region or an N-type MOSFET (NMOSFET) region. For example, the second, third and sixth active patterns FN2, FN3 and FN6 may define the PMOSFET regions, and the first, fourth and fifth active patterns FN1, FN4 and FN5 may define the NMOSFET regions. Distances between the active patterns FN1 to FN6 may be varied according to region-types of the active patterns FN1 to FN6. For example, the first active pattern FN1 may be the NMOSFET region, and the second active pattern FN2 may be the PMOSFET region different from the NMOSFET region. In this case, the distance between the first and second active patterns FN1 and FN2 may be defined as a first distance. The second and third active patterns FN2 and FN3 may be the PMOSFET regions. In other words, the second and third active pattern FN2 and FN3 may be the same kind of regions. In this case, the distance between the second and third active patterns FN2 and FN3 may be defined as a second distance. Here, the second distance may be greater than the first distance.

The first device isolation layer ST1 and the second device isolation layers ST2 may be connected to each other to define an insulating layer that is of one body or defines a unitary member. A thickness (or a depth) of the first device isolation layer ST1 may be greater than thicknesses (or depths) of the second device isolation layers ST2. In this case, the second device isolation layers ST2 may be formed by a process different from a process of forming the first device isolation layer ST1. In other embodiments, the second device isolation layers ST2 may be formed simultaneously with the first device isolation layer ST1, so the thicknesses of the second device isolation layers ST2 may be substantially equal to the thickness of the first device isolation layer ST1. The first and second device isolation layers ST1 and ST2 may be formed in an upper portion of the substrate 100. For example, the first and second device isolation layers ST1 and ST2 may include a silicon oxide layer.

Gate electrodes G1 to G6 may be provided on the active patterns FN1 to FN6. The gate electrodes G1 to G6 may extend in the first direction D1 to intersect the active patterns FN1 to FN6. The gate electrodes G1 to G6 may be spaced apart from each other in the second direction D2. The gate electrodes G1 to G6 may include first to sixth gate electrodes G1 to G6 that extend in the first direction D1 to intersect the active patterns FN1 to FN6 and the second device isolation layer ST2.

A gate insulating pattern GI may be provided under each of the gate electrodes G1 to G6, and gate spacers GS may be provided on both sidewalls of each of the gate electrodes G1 to G6. A first interlayer insulating layer 110 may be provided to fill spaces between the gate electrodes G1 to G6. A capping layer GP may be provided on the first interlayer insulating layer 110 to extend on or cover top surfaces of the gate electrodes G1 to G6 in common. Second, third, fourth and fifth interlayer insulating layers 115, 120, 130, and 140 may be sequentially stacked on the capping layer GP. A first etch stop layer ES10 may be disposed between the second and third interlayer insulating layers 115 and 120, and a second etch stop layer ES2 may be disposed between the third and fourth interlayer insulating layers 120 and 130. A third etch stop layer ES3 may be disposed between the fourth and fifth interlayer insulating layers 130 and 140.

The gate electrodes G1 to G6 may include at least one of a doped semiconductor material, a metal, or a conductive metal nitride. The gate insulating pattern GI may include at least one of a silicon oxide layer, a silicon oxynitride layer, or a high-k dielectric layer having a dielectric constant higher than that of the silicon oxide layer. Each of the capping layer GP and the gate spacer GS may include at least one of a silicon oxide layer, a silicon nitride layer, or a silicon oxynitride layer. Each of the first to fifth interlayer insulating layers 110, 115, 120, 130 and 140 may include a silicon oxide layer and/or a silicon oxynitride layer. Each of the first to third etch stop layers ES1, ES2 and ES3 may include silicon carbonitride (SiCN).

Figure 3A:
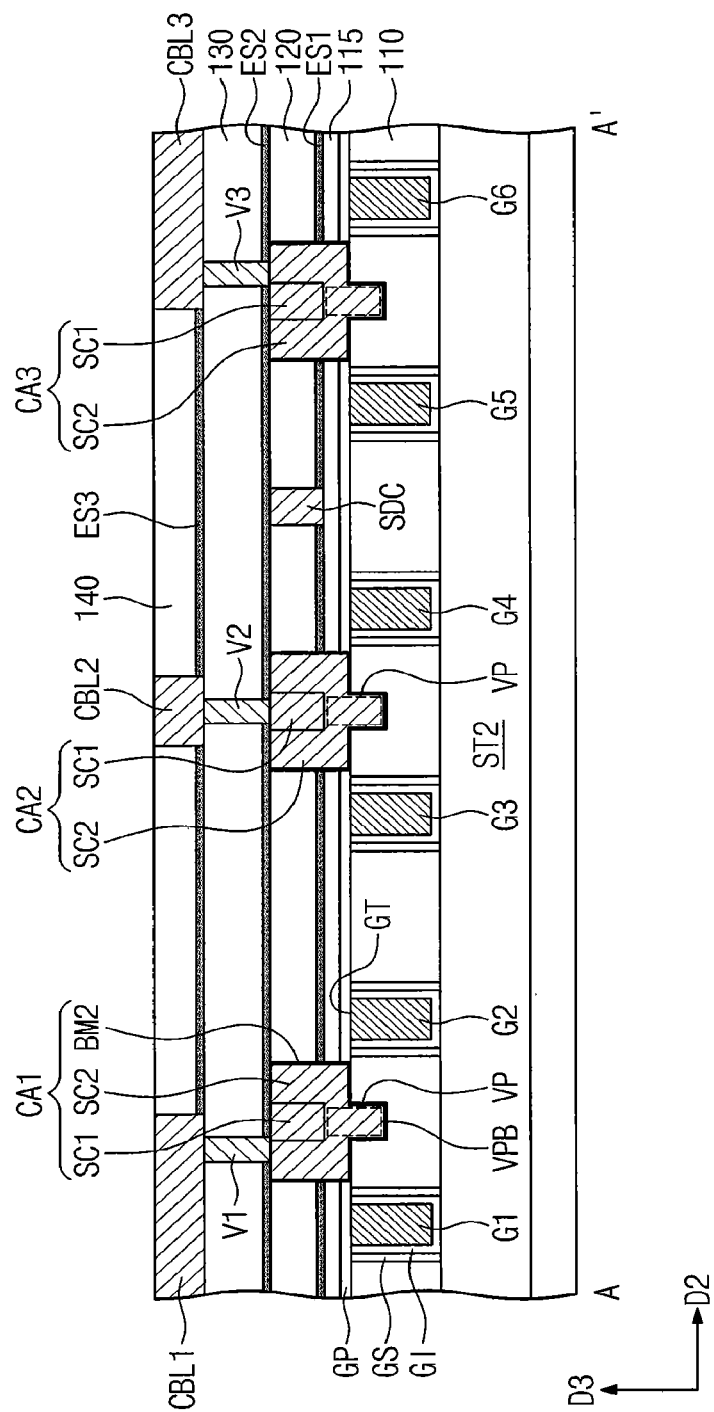
FIGS. 3A, 3B, 3C, 3D, and 3E are cross-sectional views taken along lines A-A', B-B', C-C', D-D', and E-E' of FIG. 2, respectively.
Figure 3B:
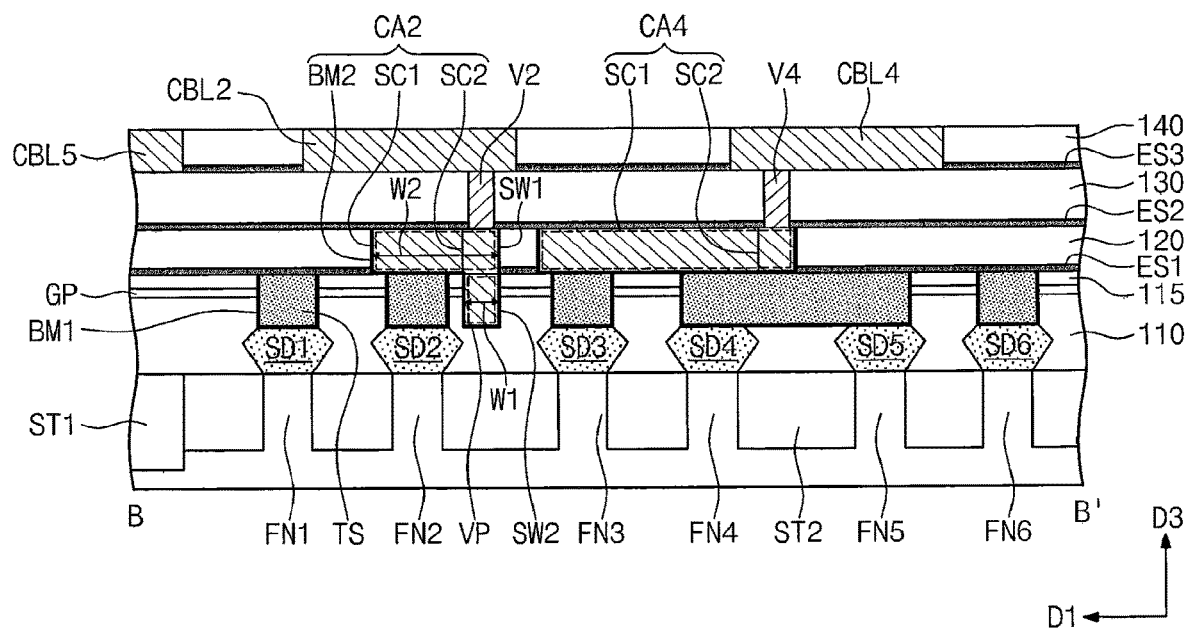
Figure 3C:
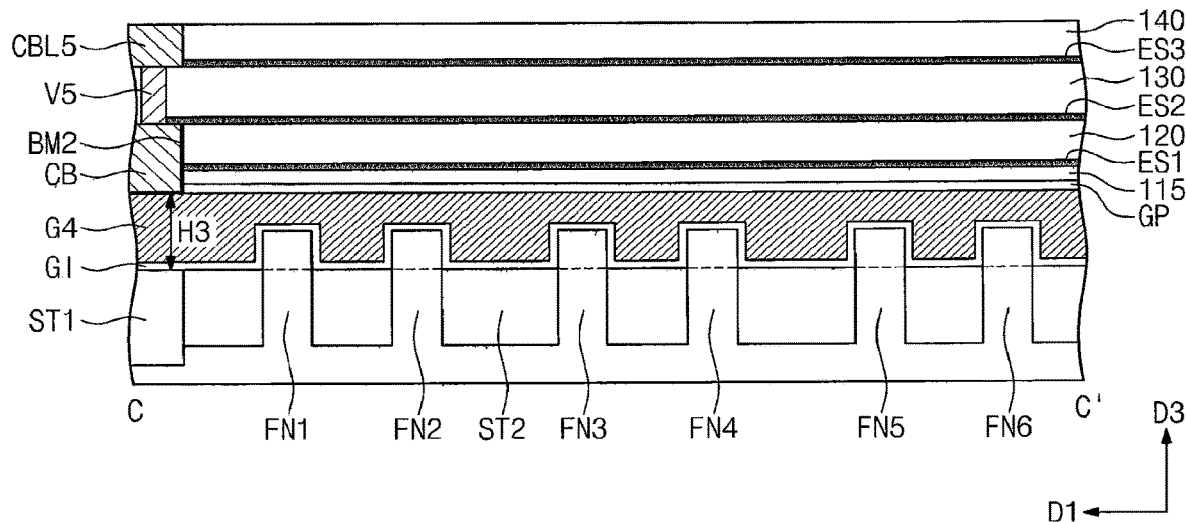
Figure 3D:
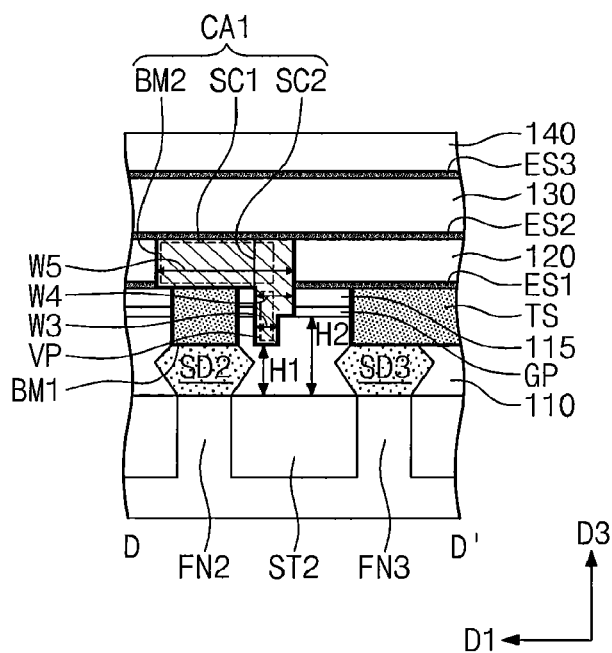
Figure 3E:
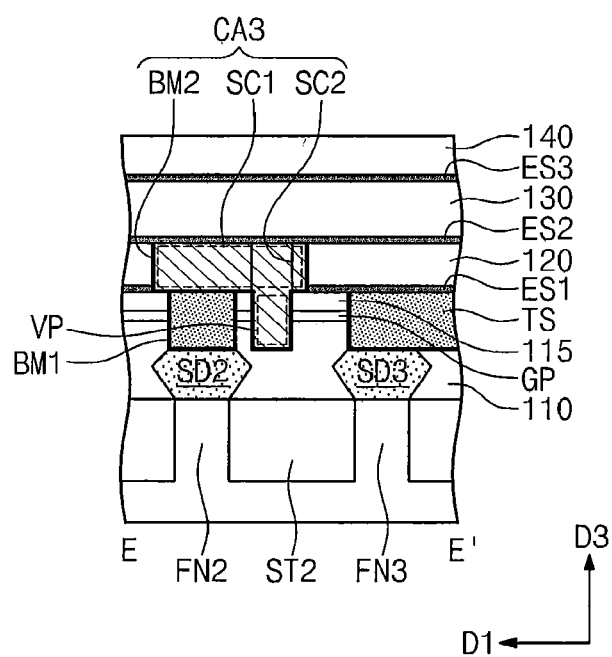

Source/drain regions SD1 to SD6 may be provided in upper portions of the active patterns FN1 to FN6 disposed at both sides of each of the gate electrodes G1 to G6. The source/drain regions SD1 to SD6 may include first to sixth source/drain regions SD1 to SD6 that are disposed in the upper portions of the first to sixth active patterns FN1 to FN6, respectively. As illustrated in FIGS. 3B, 3D, and 3E, the source/drain regions SD1 to SD6 may be disposed on the active patterns FN1 to FN6 and may extend onto the substrate 100 (i.e., onto the second device isolation layers ST2). Alternatively, the source/drains SD may be confined in the active patterns FN1 to FN6.

In some embodiments, the second, third and sixth source/drain regions SD2, SD3 and SD6 of the second, third and sixth active patterns FN2, FN3 and FN6 may be doped with P-type dopants, and the first, fourth and fifth source/drain regions SD1, SD4 and SD5 of the first, fourth and fifth active patterns FN1, FN4 and FN5 may be doped with N-type dopants. The fin portions which are disposed under and overlap with the gate electrodes G1 to G6 may be used as channel regions.

The source/drain regions SD1 to SD6 may include epitaxial patterns formed by a selective epitaxial growth (SEG) process. In other words, the upper portions of the active patterns FN1 to FN6, in which the source/drain regions SD1 to SD6 are formed, may include the epitaxial patterns. Thus, top surfaces of the source/drain regions SD1 to SD6 may be disposed at a higher level than top surfaces of the fin portions. The source/drain regions SD1 to SD6 may include a different semiconductor element from the substrate 100. For example, the source/drain regions SD1 to SD6 may include a semiconductor element of which a lattice constant is larger or smaller than that of the semiconductor element of the substrate 100. Since the source/drain regions SD1 to SD6 include the different semiconductor element from the substrate 100, the source/drain regions SD1 to SD6 may provide compressive stress or tensile stress to the channel regions. For example, if the substrate 100 is a silicon substrate, the second, third and sixth source/drain regions SD2, SD3 and SD6 of the PMOSFET regions may include embedded silicon-germanium (SiGe) or germanium (Ge). In this case, the second, third and sixth source/drain regions SD2, SD3 and SD6 may provide the compressive stress to the channel region adjacent thereto. On the other hand, if the substrate 100 is the silicon substrate, the first, fourth and fifth source/drain regions SD1, SD4 and SD5 of the NMOSFET regions may include silicon carbide (SiC). In this case, the first, fourth and fifth source/drain regions SD1, SD4 and SD5 may provide the tensile stress to the channel regions adjacent thereto. Since the source/drain regions SD1 to SD6 provide the compressive stress or the tensile stress to the channel regions, mobility of the carriers generated in the channel regions may be improved when the field effect transistors according to the inventive concepts are operated.

Conductive connection patterns TS may be provided at both sides of each of the gate electrodes G1 to G6. In some embodiments, some of the conductive connection patterns TS may be disposed to correspond to some of the source/drain regions SD1 to SD6, respectively. In other words, the some of the conductive connection patterns TS may be spaced apart from each other in the first direction D1, like the source/drain regions SD1 to SD6. On the other hand, others of the conductive connection patterns TS may electrically connect others, spaced apart from each other, of the source/drain regions SD1 to SD6 to each other. For example, the conductive connection pattern TS covering the fourth and fifth source/drain regions SD4 and SD5 in common may electrically connect the fourth and fifth source/drain regions SD4 and SD5 to each other (see FIG. 3B).

The conductive connection patterns TS may be in direct contact with the source/drain regions SD1 to SD6. The conductive connection patterns TS may include a metal silicide. For example, the conductive connection patterns TS may include at least one of titanium silicide, tantalum silicide, or tungsten silicide. The conductive connection patterns TS may further include a metal layer. For example, the metal layer may include at least one of titanium, tantalum, or tungsten. In an embodiment, each of the conductive connection patterns TS may include the metal silicide layer and the metal layer disposed on the metal silicide layer. The conductive connection patterns TS may be provided in the first and second interlayer insulating layers 110 and 115 and the capping layer GP.

First barrier layers BM1 may be provided between the conductive connection patterns TS and the first and second interlayer insulating layers 110 and 115, between the conductive connection patterns TS and the capping layer GP, and between the conductive connection patterns TS and the source/drain regions SD1 to SD6. Each of the first barrier layers BM1 may have a substantially uniform thickness and may extend on or surround each of the conductive connection patterns TS. However, top surfaces of the conductive connection patterns TS may not be covered with the first barrier layer BM1. The first barrier layer BM1 may include titanium/titanium nitride (Ti/TiN).

Source/drain contacts SDC and first to fourth active contacts CA1 to CA4 may be provided on the conductive connection patterns TS. In some embodiments, the source/drain contacts SDC may be provided at both sides of each of the gate electrodes G1 to G6 in plan view. Each of the source/drain contacts SDC may extend on or cover the top surface of the conductive connection pattern TS and may have a bar shape extending in the first direction D1. At least one of the source/drain contacts SDC may electrically connect two or more conductive connection patterns TS to each other.

Gate contacts CB may be provided on the gate electrodes G1 to G6, respectively. In some embodiments, each of the gate contacts CB may be disposed on an end portion of each of the gate electrodes G1 to G6. The gate contacts CB may penetrate the second and third interlayer insulating layers 115 and 120, the first etch stop layer ES1, and the capping layer GP so as to be in direct contact with top surfaces of the gate electrodes G1 to G6. The gate electrodes G1 to G6 may be electrically connected to conductive lines disposed thereon through the gate contacts CB and vias disposed on the gate contacts CB. For example, the fourth gate electrode G4 may be electrically connected to a fifth conductive line CBL5 through the gate contact CB and a fifth via V5 disposed on the gate contact CB.

The source/drain contacts SDC and the gate contacts CB may include at least one of a doped semiconductor material, a metal, or a conductive metal nitride. Here, the conductive connection patterns TS may include a different material from the source/drain contacts SDC. For example, the source/drain contacts SDC may include tungsten, and the conductive connection patterns TS may include a metal silicide.

In some embodiments, first, second and third active contacts CA1, CA2 and CA3 may be provided on the second active pattern FN2, and a fourth active contact CA4 may be provided on the third and fourth active patterns FN3 and FN4. The fourth active contact CA4 may intersect the third and fourth active patterns FN3 and FN4. In plan view, the first active contact CA1 may be provided between the first and second gate electrodes G1 and G2, the second and fourth active contacts CA2 and CA4 may be provided between the third and fourth gate electrodes G3 and G4, and the third active contact CA3 may be provided between the fifth and sixth gate electrodes G5 and G6.

Second barrier layers BM2 may be provided to extend on or surround sidewalls and bottom surfaces of the first to fourth active contacts CA1 to CA4. However, top surfaces of the first to fourth active contacts CA1 to CA4 may not be covered with the second barrier layers BM2. Portions of the second barrier layers BM2 may be disposed between the conductive connection patterns TS and the active contacts CA1 to CA4. The second barrier layers BM2 may include Ti/TiN. Thus, the second barrier layers BM2 may reduce or substantially prevent a metal from being diffused between the conductive connection patterns TS and the active contacts CA1 to CA4.

Hereinafter, the first active contact CA1 will be first described in more detail. The first active contact CA1 may include first and second sub-contacts or portions SC1 and SC2. The first sub-contact SC1 may be disposed on and connected to the top surface of the conductive connection pattern TS disposed on the second source/drain region SD2. On the contrary, the second sub-contact SC2 may be spaced apart from both the second source/drain region SD2 and the conductive connection pattern TS disposed on the second source/drain region SD2. In other words, the first sub-contact SC1 may overlap with the second source/drain region SD2 in plan view, but the second sub-contact SC2 may be disposed between the second and third source/drain regions SD2 and SD3 in plan view.

The first sub-contact SC1 and the second sub-contact SC2 may include the same material and may be connected to each other to define the first active contact CA1 that is of one body or defines a unitary member. The first and second sub-contacts SC1 and SC2 may include at least one of a doped semiconductor material, a metal, or a conductive metal nitride. For example, the first and second sub-contacts SC1 and SC2 may include the same material as the source/drain contacts SDC. In such embodiments, the source/drain contacts SDC may correspond to active contacts that include the first sub-contact or portion SC1 but are free of the second sub-contact or portion SC2.

The first sub-contact SC1 may be provided in the third interlayer insulating layer 120. Thus, a top surface of the first sub-contact SC1 may be substantially coplanar with a top surface of the third interlayer insulating layer 120. In addition, the top surface of the first sub-contact SC1 may be disposed at the substantially same level as top surfaces of the source/drain contacts SDC, and a bottom surface of the first sub-contact SC1 may be disposed at the substantially same level as bottom surfaces of the source/drain contacts SDC. The first sub-contact SC1 may be disposed between the first and second gate electrodes G1 and G2 in plan view. The first sub-contact SC1 may have a bar shape extending in the first direction D1.

In some embodiments, a bottom surface of the second sub-contact SC2 may be disposed at the substantially same level as bottom surfaces of the gate contacts CB. In other words, the bottom surface of the second sub-contact SC2 may be disposed at the substantially same level as the top surfaces of the gate electrodes G1 to G6. In other embodiments, the bottom surface of the second sub-contact SC2 may be disposed at a lower level than the bottom surfaces of the gate contacts CB. However, the inventive concepts are not limited thereto. A top surface of the second sub-contact SC2 may be substantially coplanar with the top surface of the first sub-contact SC1. In other words, the top surface of the second sub-contact SC2 may be substantially coplanar with the top surface of the third interlayer insulating layer 120.

The second sub-contact SC2 may include a vertical extension VP that extends toward the substrate 100 between the second and third source/drain regions SD2 and SD3. In some embodiments, a bottom surface of the vertical extension VP may be lower than the bottom surface of the first sub-contact SC1. In addition, the bottom surface of the vertical extension VP may be lower than the top surfaces of the first and second gate electrodes G1 and G2 adjacent to the vertical extension VP. In other words, the bottom surface of the vertical extension VP may be disposed at a level between the top surface of the first interlayer insulating layer 110 and a top surface of the second device isolation layer ST2. The vertical extension VP may be formed using double-etching when the first and second sub-contacts SC1 and SC2 are formed. This will be described later in more detail. As a result, the vertical extension VP may also overlap with the first sub-contact SC1 in plan view.

Referring again to FIG. 3A, the vertical extension VP may extend from the bottom surface of the second sub-contact SC2 toward the substrate 100 when viewed from a cross-sectional view taken along the second direction D2. Thus, the first active contact CA1 may have a T-shaped cross section. In addition, the second to fourth active contacts CA2 to CA4 may also have the same T-shaped cross section.

In the first active contact CA1, the second sub-contact SC2 may extend on or surround one end portion of the first sub-contact SC1 in plan view. Thus, one sidewall, adjacent to the vertical extension VP, of the second sub-contact SC2 may have a stepped profile, as illustrated in FIG. 3D. In some embodiments, the bottom surface of the vertical extension VP may be disposed at a first height H1 from the top surface of the second device isolation layer ST2, and the bottom surface of the second sub-contact SC2 may be disposed at a second height H2 from the top surface of the second device isolation layer ST2. At this time, the second height H2 may be higher than the first height H1. Thus, the one sidewall of the second sub-contact SC2 may have the stepped profile. On the other hand, the bottom surface of each of the gate contacts CB may be disposed at a third height H3 from the top surfaces of the first and second device isolation layers ST1 and ST2. Here, the third height H3 may be the same as or higher than the second height H2, as described above.

A first conductive line CBL1 may be disposed on the first active contact CA1. A first via V1 may be disposed between the first active contact CA1 and the first conductive line CBL1. In more detail, the first via V1 may be provided on the first active contact CA1. The first conductive line CBL1 may be electrically connected to the second source/drain region SD2 through the first via V1 and the first active contact CA1 to exchange input/output signals with the second source/drain region SD2. The first via V1 may be provided in the fourth interlayer insulating layer 130, and the first conductive line CBL1 may be provided in the fifth interlayer insulating layer 140.

The second sub-contact SC2 may be formed at the same level as the gate contacts CB, and the first active contact CA1 may be laterally enlarged from the first sub-contact SC1 to over the second device isolation layer ST2 due to the second sub-contact SC2. Thus, the first via V1 may be stably formed on the first active contact CA1 having an enlarged planar area. As a result, when the first via V1 is formed, misalignment between the first via V1 and the first active contact CA1 may be reduced or substantially prevented and a process margin may be improved. This means that reliability of the semiconductor devices may be improved. In other words, the second sub-contact SC2 may act as a pad on which the first via V1 is disposed. In addition, a contact area between the first active contact CA1 and the first via V1 may be increased by the enlarged planar area of the first active contact CA1, and thus, semiconductor devices with a low contact resistance may be realized.

The first active contact CA1 described above may be one example according to some embodiments of the inventive concepts. Hereinafter, the second active contact CA2 corresponding to another example of the inventive concepts will be described in more detail. Hereinafter, the descriptions to the same features as in the first active contact CA1 will be omitted or mentioned briefly. In other words, differences between the second active contact CA2 and the first active contact CA1 will be mainly described.

The second active contact CA2 may include first and second sub-contacts SC1 and SC2. Unlike the first active contact CA1, one sidewall of the first sub-contact SC1 of the second active contact CA2 may be aligned with one sidewall of the second sub-contact SC2 of the second active contact CA2 (see FIG. 3B). In other words, the first sub-contact SC1 of the second active contact CA2 may have a first sidewall SW1, and the second sub-contact SC2 of the second active contact CA2 may have a second sidewall SW2 adjacent to the first sidewall SW1. Here, the first sidewall SW1 and the second sidewall SW2 may be coplanar with each other.

A second conductive line CBL2 may be disposed on the second active contact CA2. A second via V2 may be disposed between the second active contact CA2 and the second conductive line CBL2. In more detail, the second via V2 may be provided on the second active contact CA2. The second sub-contact SC2 of the second active contact CA2 may act as a pad on which the second via V2 is disposed.

The third active contact CA3 may include first and second sub-contacts SC1 and SC2. Unlike the first active contact CA1, the first sub-contact SC1 of the third active contact CA3 may extend in the first direction D1 to penetrate the second sub-contact SC2 in plan view. In other words, as illustrated in FIG. 3E, the first sub-contact SC1 of the third active contact CA3 may laterally protrude from one sidewall of the second sub-contact SC2 of the third active contact CA3 when viewed from a cross-sectional view taken along the first direction D1. This is because the first sub-contact SC1 of the third active contact CA3 may be offset from the second sub-contact SC2 of the third active contact CA3 in a direction opposite to the first direction D1.

A third conductive line CBL3 may be disposed on the third active contact CA3. A third via V3 may be disposed between the third active contact CA3 and the third conductive line CBL3. In more detail, the third via V3 may be provided on the third active contact CA3. The second sub-contact SC2 of the third active contact CA3 may act as a pad on which the third via V3 is disposed.

Referring again to FIGS. 2 and 3B, the fourth active contact CA4 may include first and second sub-contacts SC1 and SC2. Unlike the first active contact CAL the second sub-contact SC2 of the fourth active contact CA4 may be disposed on the conductive connection pattern TS connecting the fourth and fifth source/drain regions SD4 and SD5 to each other. Thus, the second sub-contact SC2 of the fourth active contact CA4 may not include a vertical extension due to the conductive connection pattern TS. Meanwhile, the first sub-contact SC1 of the fourth active contact CA4 may be connected to two conductive connection patterns TS adjacent to each other. Thus, the third, fourth and fifth source/drain regions SD3, SD4 and SD5 may be electrically connected to each other through the fourth active contact CA4 and the conductive connection patterns TS.

A fourth conductive line CBL4 may be disposed on the fourth active contact CA4. A fourth via V4 may be disposed between the fourth active contact CA4 and the fourth conductive line CBL4. In more detail, the fourth via V4 may be provided on the fourth active contact CA4. The second sub-contact SC2 of the fourth active contact CA4 may act as a pad on which the fourth via V4 is disposed.

[Manufacturing Method]

Figure 4:
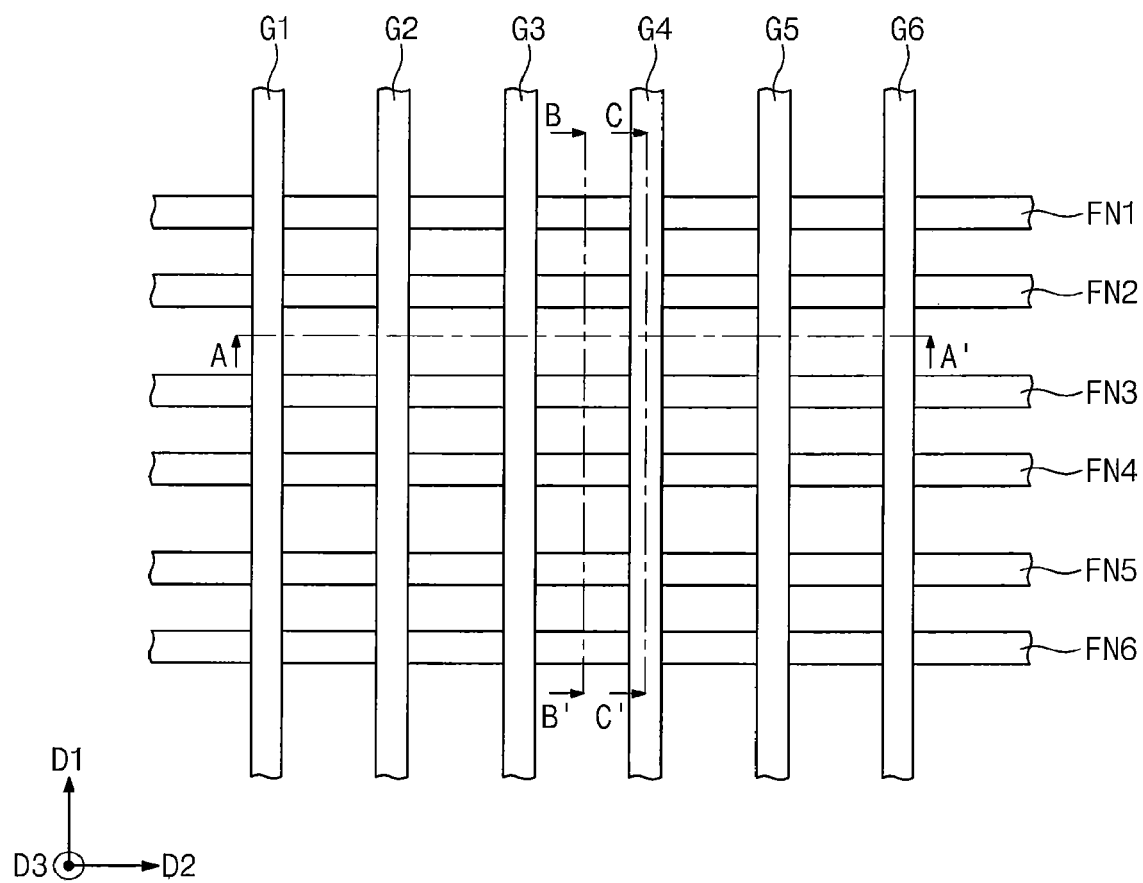
FIGS. 4, 6, and 8 are plan views illustrating methods for manufacturing semiconductor devices according to example embodiments of the inventive concepts.
Figure 5A:
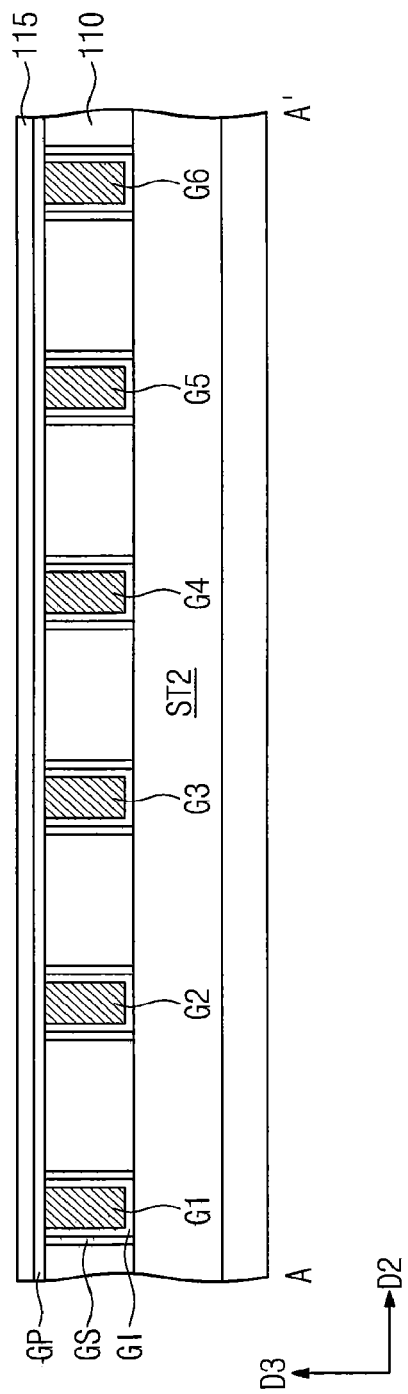
FIGS. 5A, 7A, and 9A are cross-sectional views taken along lines A-A' of FIGS. 4, 6, and 8, respectively.
Figure 5B:
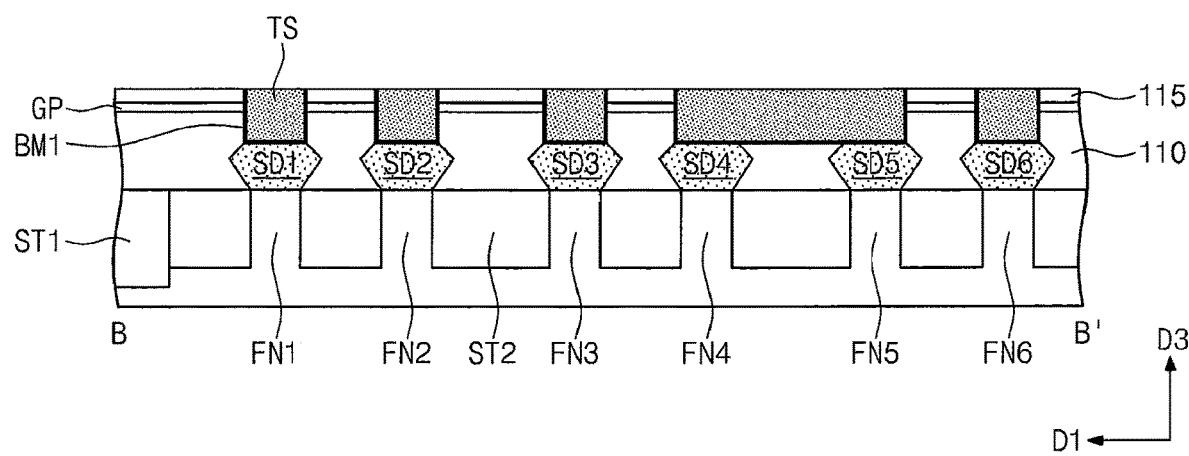
FIGS. 5B, 7B, and 9B are cross-sectional views taken along lines B-B' of FIGS. 4, 6, and 8, respectively.
Figure 5C:
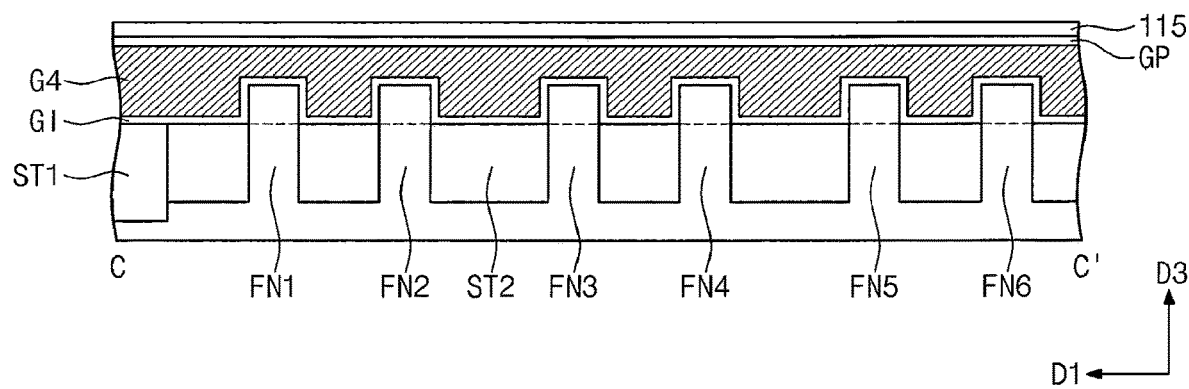
FIGS. 5C, 7C, and 9C are cross-sectional views taken along lines C-C' of FIGS. 4, 6, and 8, respectively.
Figure 6:
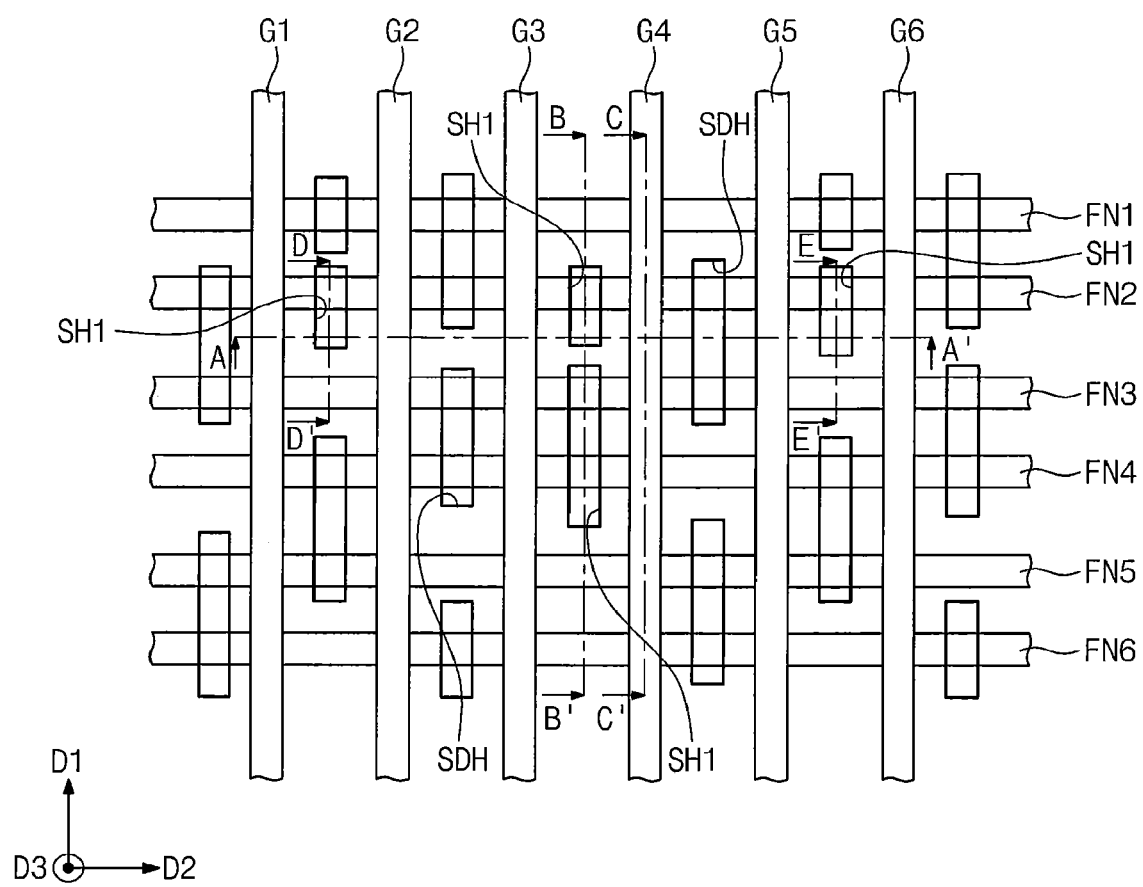
Figure 7A:
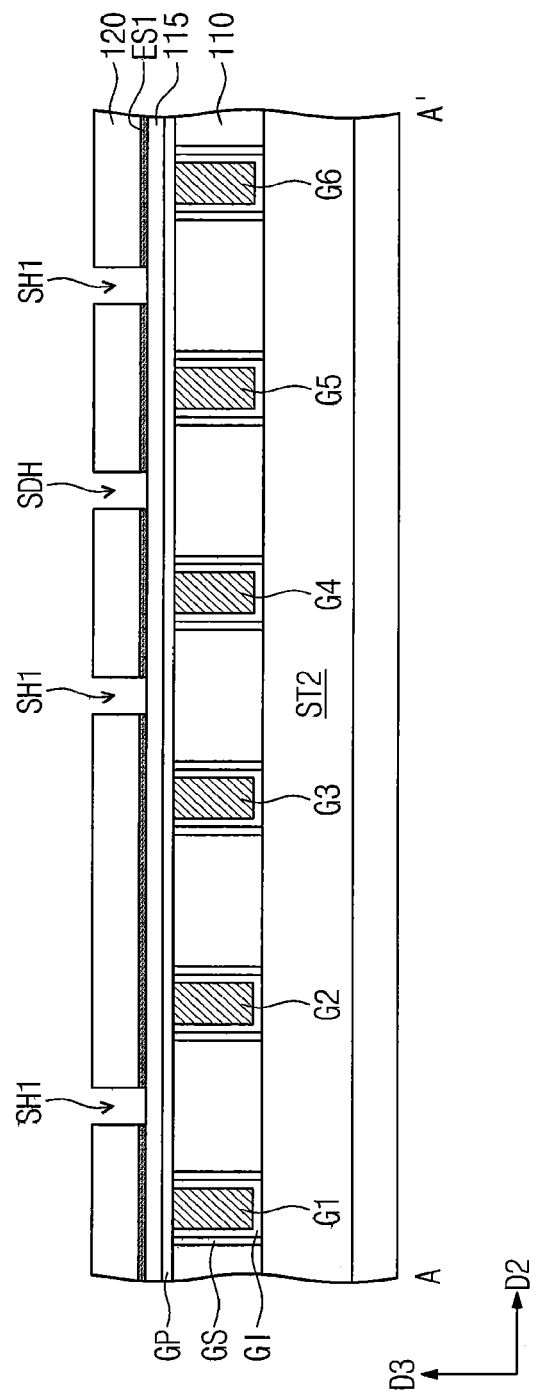
Figure 7B:
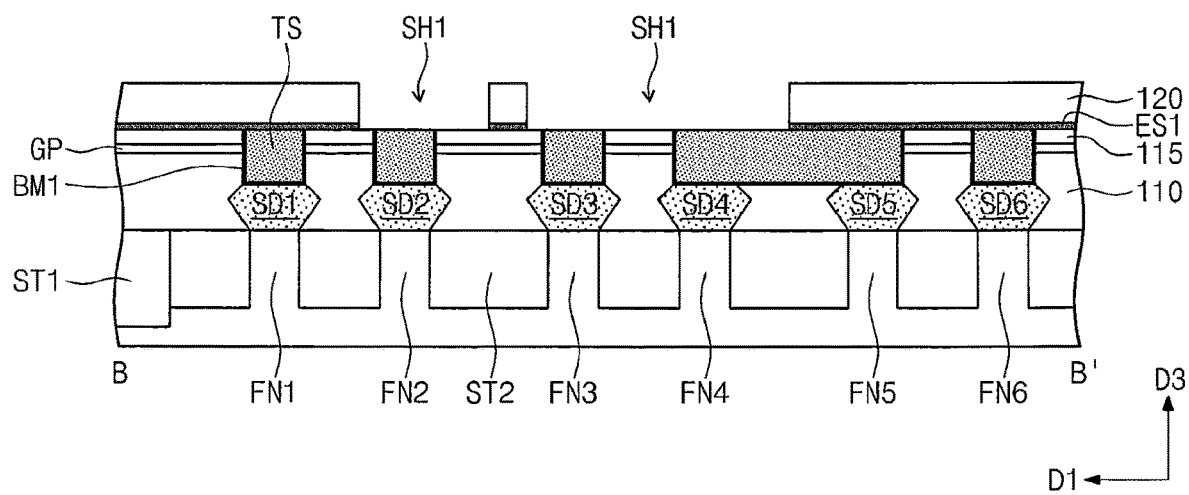
Figure 7C:
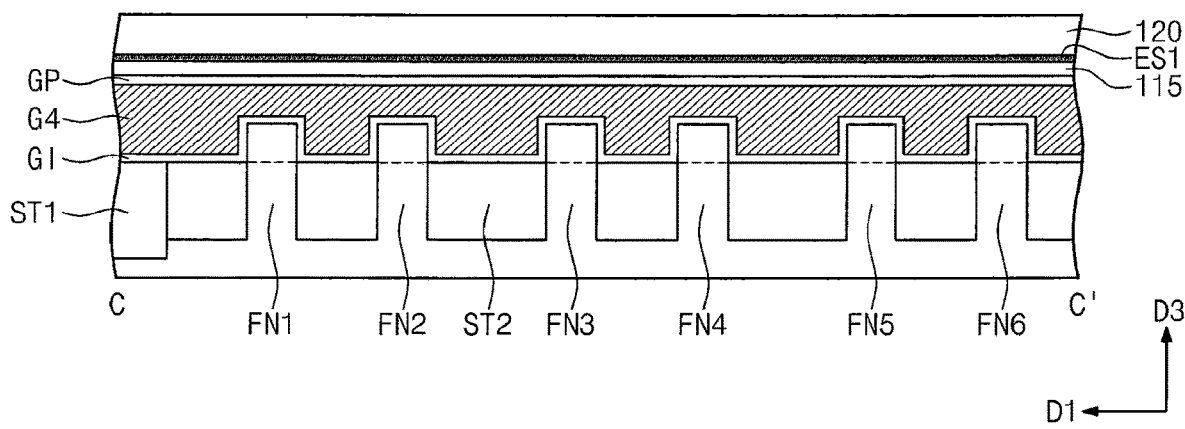
Figure 7D:
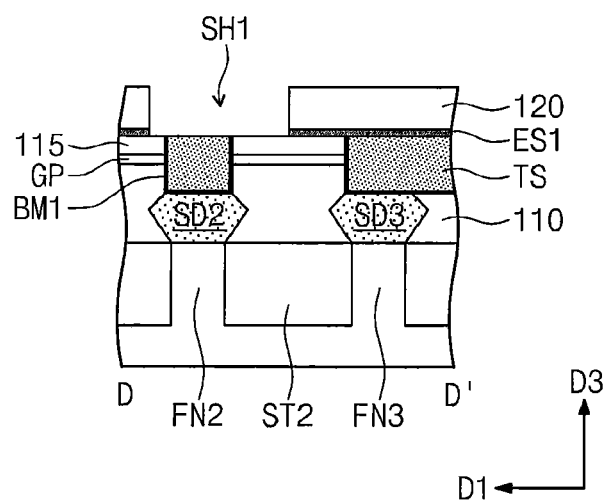
FIGS. 7D and 9D are cross-sectional views taken along lines D-D' of FIGS. 6 and 8, respectively.
Figure 7E:
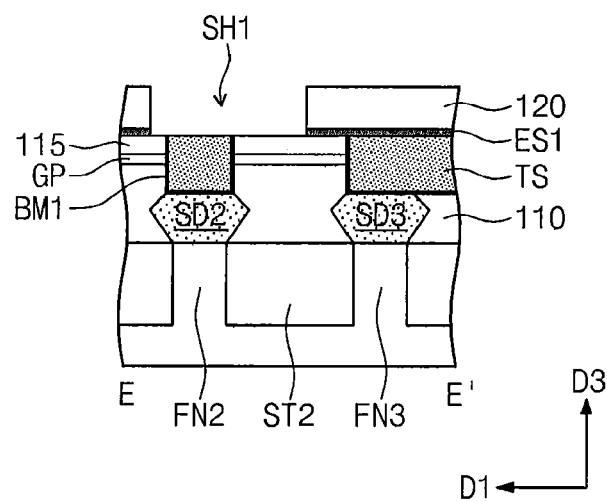
FIGS. 7E and 9E are cross-sectional views taken along lines E-E' of FIGS. 6 and 8, respectively.
Figure 8:
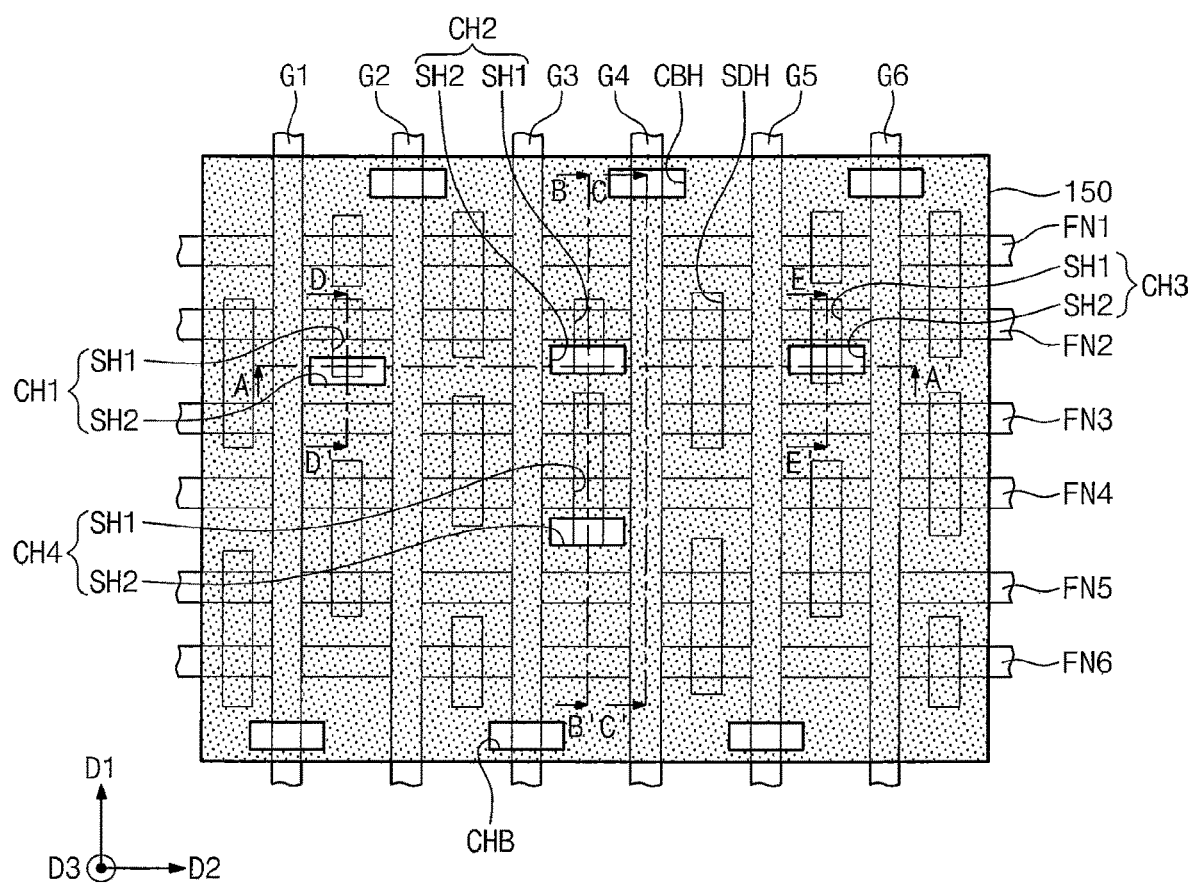
Figure 9A:
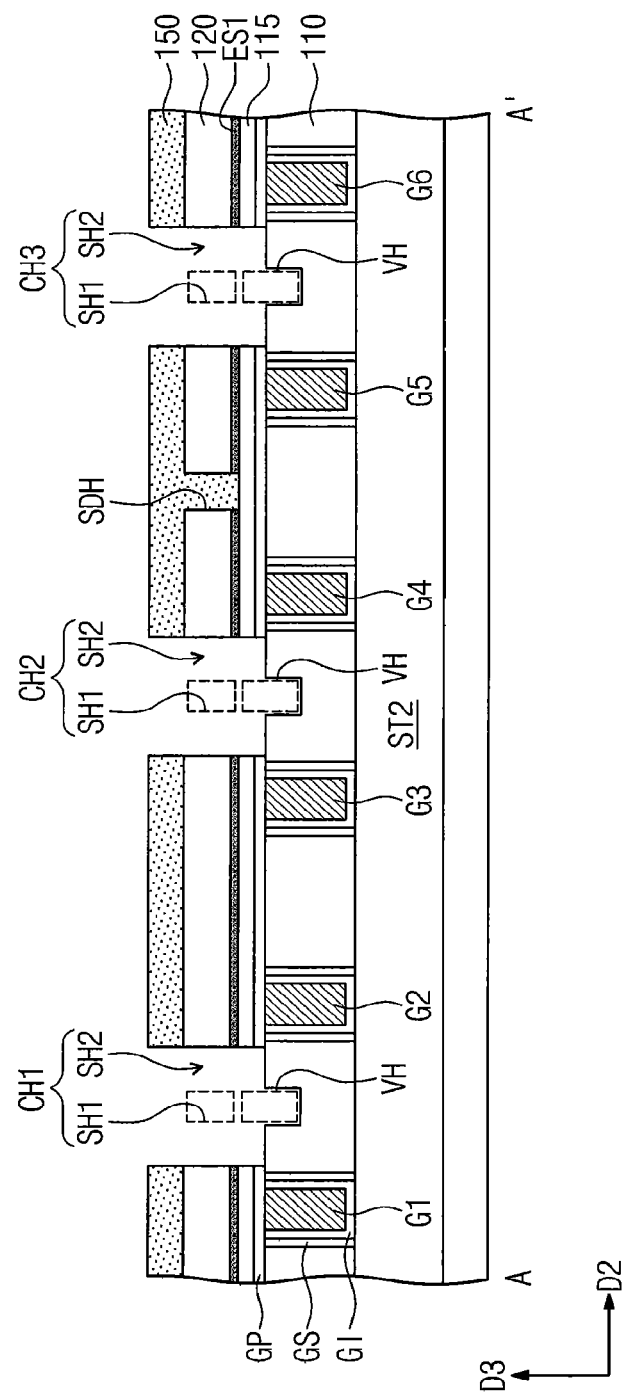
Figure 9B:
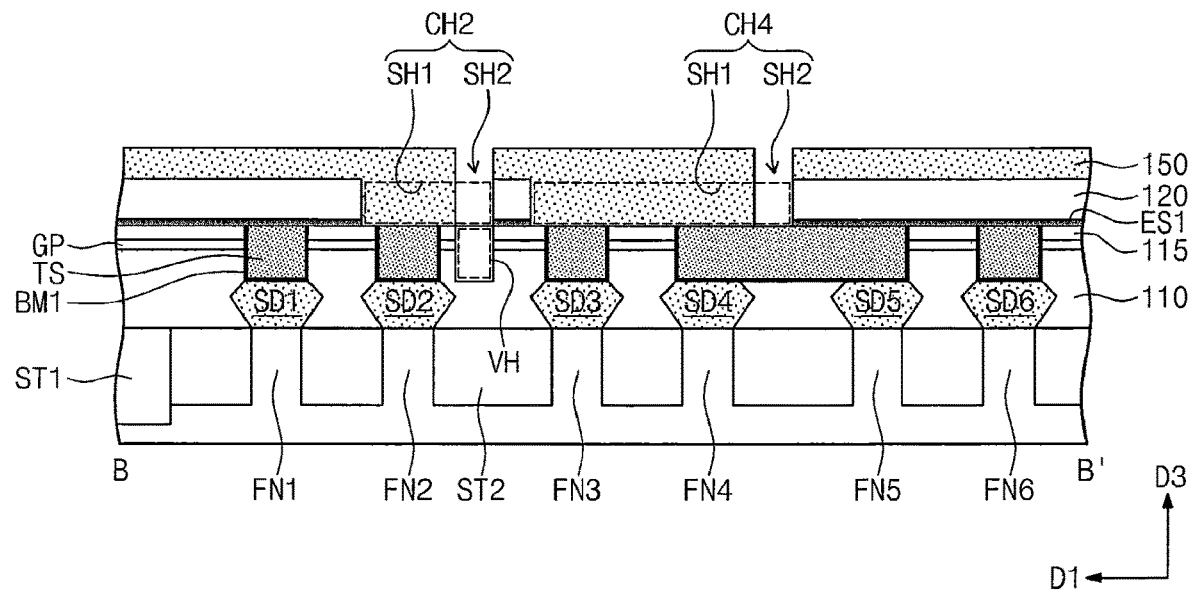
Figure 9C:
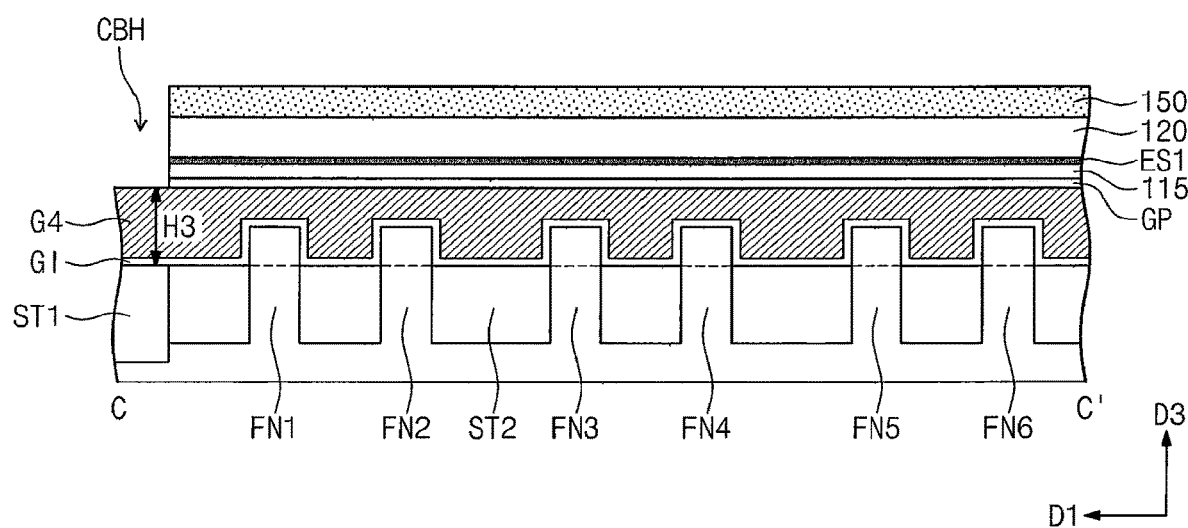
Figure 9D:
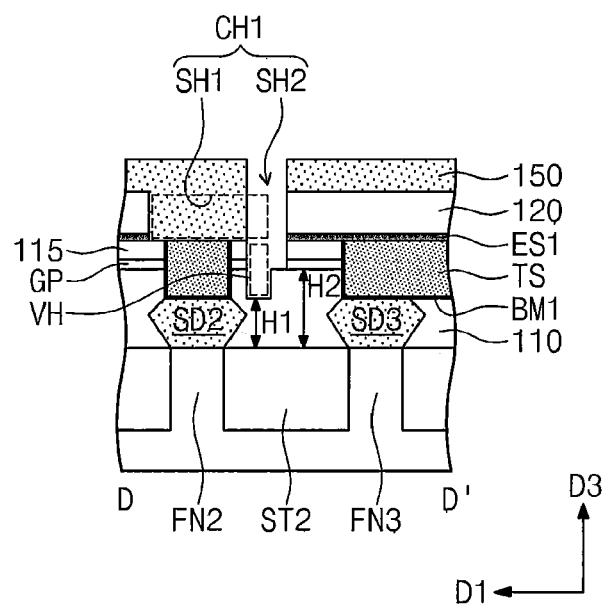
Figure 9E:
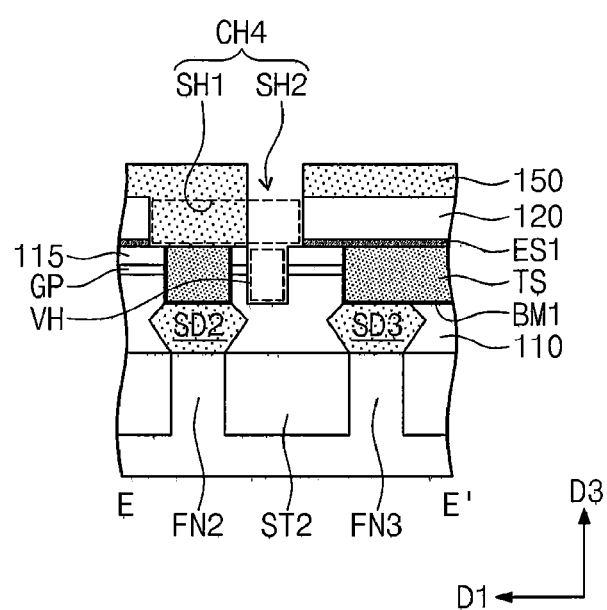

FIGS. 4, 6, and 8 are plan views illustrating methods for manufacturing semiconductor devices according to example embodiments of the inventive concepts. FIGS. 5A, 7A, and 9A are cross-sectional views taken along lines A-A' of FIGS. 4, 6, and 8, respectively. FIGS. 5B, 7B, and 9B are cross-sectional views taken along lines B-B' of FIGS. 4, 6, and 8, respectively. FIGS. 5C, 7C, and 9C are cross-sectional views taken along lines C-C' of FIGS. 4, 6, and 8, respectively. FIGS. 7D and 9D are cross-sectional views taken along lines D-D' of FIGS. 6 and 8, respectively. FIGS. 7E and 9E are cross-sectional views taken along lines E-E' of FIGS. 6 and 8, respectively.

Referring to FIGS. 4, 5A, 5B and 5C, a first device isolation layer ST1 may be formed in a substrate 100 to define logic cells. In addition, second device isolation layers ST2 may be formed in the substrate 100 of each of the logic cells to define a plurality of active patterns FN1 to FN6. The second device isolation layers ST2 may extend in the second direction D2, so the active patterns FN1 to FN6 may extend in the second direction D2 and may be spaced apart from each other in the first direction D1. The substrate 100 may be, for example, a silicon substrate, a germanium substrate, or a SOI substrate. The first and second device isolation layers ST1 and ST2 may be formed by a shallow-trench isolation (STI) process and may include, for example, a silicon oxide layer.

Each of the first and second device isolation layers ST1 and ST2 may have a depth in a direction opposite to the third direction D3. The third direction D3 may be perpendicular to the first and second directions D1 and D2 and may be perpendicular to the top surface of the substrate 100. In some embodiments, the depths of the second device isolation layers ST2 may be smaller than that of the first device isolation layer ST1. In this case, the second device isolation layers ST2 may be formed by a process different from a process of forming the first device isolation layer ST1. In other embodiments, the first and second device isolation layers ST1 and ST2 may be formed at the same time, and the second device isolation layers ST2 may have the substantially same depth as the first device isolation layer ST1.

The active patterns FN1 to FN6 may include first to sixth active patterns FN1 to FN6. The active patterns FN1 to FN6 may include fin portions protruding from between the second device isolation layers ST2. The fin portions may correspond to upper portions of the active patterns FN1 to FN6.

Gate electrodes G1 to G6 may be disposed on the substrate 100 and may extend in the first direction D1 to intersect the active patterns FN1 to FN6. The gate electrodes G1 to G6 may include first to sixth gate electrodes G1 to G6 which extend in parallel to each other and intersect the active patterns FN1 to FN6. The gate electrodes G1 to G6 may be spaced apart from each other in the second direction D2.

A gate insulating pattern GI may be formed between each of the gate electrodes G1 to G6 and the substrate 100. Gate spacers GS may be formed on both sidewalls of each of the gate electrodes G1 to G6. The gate insulating pattern GI may extend to be disposed between each of the gate electrodes G1 to G6 and the gate spacers GS. Forming the gate electrodes G1 to G6, the gate insulating patterns GI, and the gate spacers GS may include forming sacrificial gate patterns on the substrate 100, forming the gate spacers GS on both sidewalls of each of the sacrificial gate patterns, and replacing the sacrificial gate patterns with the gate insulating patterns GI and the gate electrodes G1 to G6. The gate insulating patterns GI may include at least one of a silicon oxide layer, a silicon oxynitride layer, or a high-k dielectric layer having a dielectric constant higher than that of the silicon oxide layer. The gate electrodes G1 to G6 may include at least one of a doped semiconductor material, a metal, or a conductive metal nitride. The gate spacers GS may include at least one of a silicon oxide layer, a silicon nitride layer, a silicon oxynitride layer.

In some embodiments, ion implantation processes may be performed on the substrate 100 having the gate electrodes G1 to G6 to form source/drain regions SD1 to SD6 in active patterns FN1 to FN6 at both sides of each of the gate electrodes G1 to G6. First to sixth source/drain regions SD1 to SD6 may be respectively formed in the first to sixth active patterns FN1 to FN6 at both sides of each of the gate electrodes G1 to G6. The source/drain regions SD1 to SD6 may not be formed in the fin portions of the active patterns FN1 to FN6, which are disposed under and overlap with the gate electrodes G1 to G6.

The second, third and sixth active patterns FN2, FN3 and FN6 may define PMOSFET regions, so the second, third and sixth source/drain regions SD2, SD3 and SD6 may be doped with P-type dopants. The first, fourth and fifth active patterns FN1, FN4 and FN5 may define NMOSFET regions, so the first, fourth and fifth source/drain regions SD1, SD4 and SD5 may be doped with N-type dopants.

In other embodiments, as illustrated in FIG. 5B, forming the source/drain regions SD1 to SD6 may include forming epitaxial patterns on the active patterns FN1 to FN6. Forming the epitaxial patterns may include removing upper portions of the active patterns FN1 to FN6 at both sides of each of the gate electrodes G1 to G6, and performing a selective epitaxial growth (SEG) process using exposed lower portions of the active patterns FN1 to FN6 as seeds or seed layers. The epitaxial patterns may be doped in-situ or may be doped using ion implantation processes. The epitaxial patterns may correspond to upper portions of the active patterns FN1 to FN6. In other words, the upper portions of the active patterns FN1 to FN6 at both sides of each of the gate electrodes G1 to G6 may be replaced with or may otherwise include the epitaxial patterns.

A first interlayer insulating layer 110 may be formed on the substrate 100 to extend on or cover the source/drain regions SD1 to SD6 and to fill spaces between the gate electrodes G1 to G6. In some embodiments, the epitaxial patterns and the first interlayer insulating layer 110 may be formed before replacing the sacrificial gate patterns with the gate insulating patterns GI and the gate electrodes G1 to G6. The first interlayer insulating layer 110 may be planarized to expose top surfaces of the sacrificial gate patterns, and then, the sacrificial gate patterns may be replaced with the gate insulating patterns GI and the gate electrodes G1 to G6. A capping layer GP may be formed on the first interlayer insulating layer 110 to extend on or cover top surfaces of the gate electrodes G1 to G6. The capping layer GP may include at least one of a silicon oxide layer, a silicon nitride layer, a silicon oxynitride layer. A second interlayer insulating layer 115 may be formed on the capping layer GP. Each of the first and second interlayer insulating layers 110 and 115 may include at least one of a silicon oxide layer or a silicon oxynitride layer.

Conductive connection patterns TS may be formed to penetrate the first and second interlayer insulating layers 110 and 115 and the capping layer GP. The conductive connection patterns TS may be connected to the source/drain regions SD1 to SD6. Forming the conductive connection patterns TS may include forming recess regions penetrating the first and second interlayer insulating layers 110 and 115 and the capping layer GP to expose the source/drain regions SD1 to SD6, filling the recess regions with a conductive material, and planarizing the conductive material until the second interlayer insulating layer 115 is exposed. In addition, a first barrier layer BM1 may be deposited on inner surfaces of the recess regions before the recess regions are filled with the conductive material. The first barrier layer BM1 may include Ti/TiN.

The conductive connection patterns TS may include a metal silicide. For example, the conductive connection patterns TS may include at least one of titanium silicide, tantalum silicide, or tungsten silicide. The conductive connection patterns TS may further include a metal layer. For example, the metal layer may include at least one of a titanium layer, a tantalum layer, or a tungsten layer. In an embodiment, the conductive connection patterns TS may include the metal silicide layer and the metal layer disposed on the metal silicide layer.

In some embodiments, some of the conductive connection patterns TS may be disposed to correspond to some of the source/drain regions SD1 to SD6, respectively. Others of the conductive connection patterns TS may electrically connect the source/drain regions, spaced apart from each other in the first direction D1, to each other. Top surfaces of the conductive connection patterns TS may be disposed at a higher level than the top surfaces of the gate electrodes G1 to G6.

Referring to FIGS. 6, 7A, 7B, 7C, 7D, and 7E, a first etch stop layer ES1 and a third interlayer insulating layer 120 may be sequentially formed on the resultant structure including the conductive connection patterns TS. The first etch stop layer ES1 may include SiCN, and the third interlayer insulating layer 120 may include at least one of a silicon oxide layer or a silicon oxynitride layer. The first etch stop layer ES1 may reduce or substantially prevent a metal included in the conductive connection patterns TS from being diffused through the exposed top surfaces of the conductive connection patterns TS.

The third interlayer insulating layer 120 and the first etch stop layer ES1 may be patterned using a first photo mask to form first sub-contact holes SH1 and source/drain contact holes SDH. In other words, the first sub-contact holes SH1 and the source/drain contact holes SDH may be formed using a first photolithography process at the same time. The process of patterning the third interlayer insulating layer 120 and the first etch stop layer ES1 may be performed until a top surface of the second interlayer insulating layer 115 and top surfaces of the conductive connection patterns TS are exposed.

In some embodiments, the first sub-contact holes SH1 may be formed between the first and second gate electrodes G1 and G2, between the third and fourth gate electrodes G3 and G4, and between the fifth and sixth gate electrodes G5 and G6, respectively, in plan view. Some of the first sub-contact holes SH1 may be formed on the second source/drain regions SD2, respectively, and another of the first sub-contact holes SH1 may be formed on the third and fourth source/drain regions SD3 and SD4. The first sub-contact holes SH1 may have bar shapes extending in the first direction D1 in plan view.

The source/drain contact holes SDH may have the substantially same depth as the first sub-contact holes SH1. In addition, source/drain contact holes SDH may have the substantially same width as the first sub-contact holes SH1. The source/drain contact holes SDH may expose the conductive connection patterns TS at both sides of the gate electrodes G1 to G6, like the first sub-contact holes SH1. The source/drain contact holes SDH may have bar shapes that extend along the top surfaces of the conductive connection patterns TS in the first direction D1.

Referring to FIGS. 8, 9A, 9B, 9C, 9D, and 9E, a mask layer 150 may be formed on the third interlayer insulating layer 120 to fill the first sub-contact holes SH1 and the source/drain contact holes SDH. The mask layer 150 may include, for example, a spin-on-hardmask (SOH) material.

The mask layer 150 may be patterned using a second photo mask to form second sub-contact holes SH2 and gate contact holes CBH. The second photo mask may be different from the first photo mask described above. In other words, the second sub-contact holes SH2 and the gate contact holes CBH may be formed using a second photolithography process at the same time. The first to third interlayer insulating layers 110, 115 and 120 and the first etch stop layer ES1 may also be patterned while the mask layer 150 is patterned. The process of patterning the mask layer 150 may be performed until the gate electrodes G1 to G6 are exposed through the gate contact holes CBH. In other words, portions of the capping layer GP disposed on the gate electrodes G1 to G6 may be completely removed when the gate contact holes CBH are formed.

Each of some of the second sub-contact holes SH2 may be formed between the second and third source/drain regions SD2 and SD3 in plan view. Another of the second sub-contact holes SH2 may be formed between the fourth and fifth source/drain regions SD4 and SD5 in plan view. The second sub-contact holes SH2 may be connected to the first sub-contact holes SH1, respectively. In other words, in plan view, a first communicating hole CH1 may be formed between the first and second gate electrodes G1 and G2, second and fourth communicating holes CH2 and CH4 may be formed between the third and fourth gate electrodes G3 and G4, and a third communicating hole CH3 may be formed between the fifth and sixth gate electrodes G5 and G6.

In more detail, each of the first to fourth communicating holes CH1 to CH4 may include the first sub-contact hole SH1 and the second sub-contact hole SH2. The second sub-contact hole SH2 may include a vertical extension hole VH extending toward the top surface of the substrate 100. A bottom surface of the vertical extension hole VH may be disposed at a level between a top surface of the first interlayer insulating layer 110 and a top surface of the second device isolation layer ST2.

Referring again to FIGS. 6 and 8, the first sub-contact holes SH1 may be formed using the first photolithography process which uses first layouts defining positions of the first sub-contact holes SH1. The second sub-contact holes SH2 may be formed using the second photolithography process which uses second layouts defining positions of the second sub-contact holes SH2. Here, the second layouts may overlap with portions of the first layouts, respectively. Thus, portions of bottom surfaces of the first sub-contact holes SH1 may be etched again during the patterning process using the second photolithography process (double-etching). As a result, an overlapping region of the second and first sub-contact holes SH2 and SH1 (e.g., an overlapping region of the first and second layouts) may be over-etched to form the vertical extension hole VH. The vertical extension hole VH may also overlap with the first sub-contact hole SH1 in plan view.

Referring again to FIG. 9D, the bottom surface of the vertical extension hole VH may be positioned at a first height H1 from the top surface of the second device isolation layer ST2, and a bottom surface of the second sub-contact hole SH2 may be positioned at a second height H2 from the top surface of the second device isolation layer ST2. Here, the second height H2 may be higher than the first height H1. Thus, one sidewall of the second sub-contact SH2 of the first communicating hole CH1 may have a stepped profile. Meanwhile, a bottom surface of each of the gate contact holes CBH may be positioned at a third height H3 from the top surfaces of the first and second device isolation layers ST1 and ST2. Here, the third height H3 may be the substantially same as or higher than the second height H2.

Referring again to FIGS. 2 and 3A to 3E, the mask layer 150 may be removed. The mask layer 150 may be removed using an ashing process and/or a strip process. Thereafter, a second barrier layer BM2 and a conductive layer may be formed on the third interlayer insulating layer 120 to fill the first to fourth communicating holes CH1 to CH4, the gate contact holes CBH, and the source/drain contact holes SDH. The second barrier layer BM2 may include Ti/TiN, and the conductive layer may include at least one of a doped semiconductor material, a metal, or a conductive metal nitride. The conductive layer and the second barrier layer BM2 may be planarized until the third interlayer insulating layer 120 is exposed, thereby forming first to fourth active contacts CA1 to CA4 in the first to fourth communicating holes CH1 to CH4, gate contacts CB in the gate contact holes CBH, and source/drain contacts SDC in the source/drain contact holes SDH, respectively. In more detail, each of the first to fourth active contacts CA1 to CA4 may include first and second sub-contacts SC1 and SC2 constituting one body. Each of the second barrier layers BM2 may extend on or surround each of the first to fourth active contacts CA1 to CA4. In particular, portions of the second barrier layers BM2 may be disposed between the conductive connection patterns TS and the active contacts CA1 to CA4, respectively.

Next, a second etch stop layer ES2, a fourth interlayer insulating layer 130, a third etch stop layer ES3, and a fifth interlayer insulating layer 140 may be sequentially formed on the third interlayer insulating layer 120 to extend on or cover the first to fourth active contacts CA1 to CA4, the gate contacts CB, and the source/drain contacts SDC. Vias V1 to V5 and conductive lines CBL1 to CBL5 may be formed. The vias V1 to V5 may penetrate the fourth interlayer insulating layer 130, and the conductive lines CBL1 to CBL5 may be formed in the fifth interlayer insulating layer 140.

The first to fourth vias V1 to V4 may be formed on the first to fourth active contacts CA1 to CA4, respectively. Each of the first to fourth active contacts CA1 to CA4 may include the second sub-contact SC2 which is formed simultaneously with the gate contacts CB. The second sub-contacts SC2 may further enlarge planar contact areas of the first to fourth active contacts CA1 to CA4, and thus, misalignment of the first to fourth vias V1 to V4 may be reduced or minimized or substantially prevented. This means that a margin of the process for forming the first to fourth vias V1 to V4 may be improved. In addition, contact areas of the active contacts CA1 to CA4 and the vias V1 to V4 may be increased by the wide planar areas of the active contacts CA1 to CA4. Thus, it is possible to realize semiconductor devices with a low contact resistance and excellent reliability through less complex processes.

[Applications]

Figure 10:
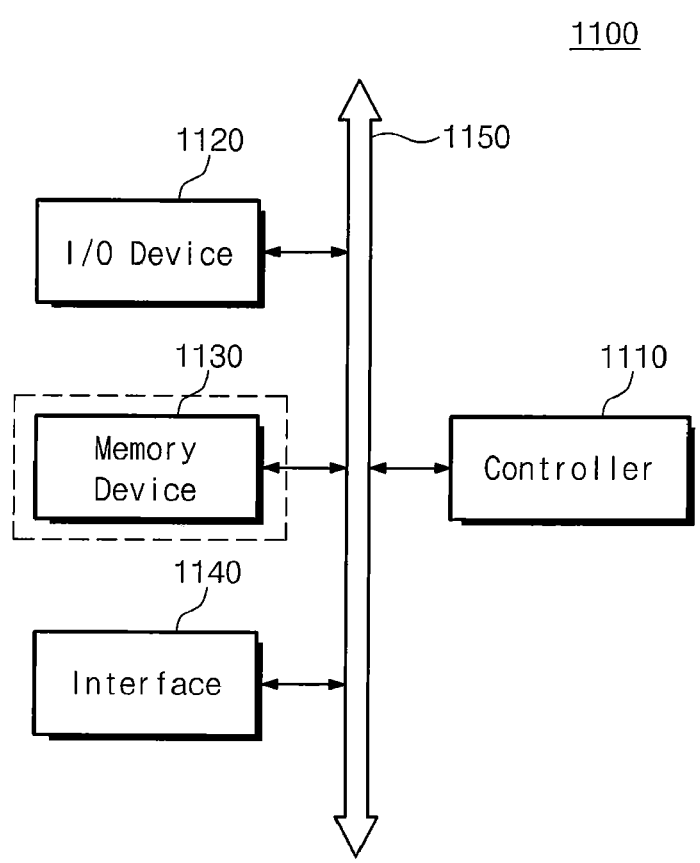
FIG. 10 is a schematic block diagram illustrating an electronic system including semiconductor devices according to example embodiments of the inventive concepts.

FIG. 10 is a schematic block diagram illustrating an electronic system including semiconductor devices according to example embodiments of the inventive concepts.

Referring to FIG. 10, an electronic system 1100 according to an embodiment of the inventive concept may include a controller 1110, an input/output (I/O) device 1120, a memory device 1130, an interface unit 1140, and a data bus 1150. At least two of the controller 1110, the I/O device 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or other logic devices having a similar function to any one thereof. The I/O device 1120 may include a keypad, a keyboard and/or a display device. The memory device 1130 may store data and/or commands. The memory device 1130 may include a non-volatile memory device (e.g., a flash memory device, a phase change memory device, and/or a magnetic memory device). In addition, the memory device 1130 may further include a volatile memory device. In this case, the memory device 1130 may include a SRAM device including semiconductor devices according to the aforementioned embodiments of the inventive concepts. The memory device 1130 may be omitted according to application of the electronic system 1100 or an electronic product implemented with the electronic system 1100. The interface unit 1140 may transmit electrical data to a communication network or may receive electrical data from a communication network. The interface unit 1140 may operate wirelessly or by cable. For example, the interface unit 1140 may include an antenna or a wireless/cable transceiver. Semiconductor devices according to the aforementioned embodiments of the inventive concepts may be applied to the controller 1110 or a portion of the I/O device 1120. The electronic system 1100 may further include a fast dynamic random access memory (DRAM) device and/or a fast SRAM device which acts as a cache memory for improving an operation of the controller 1110.

Figure 11:
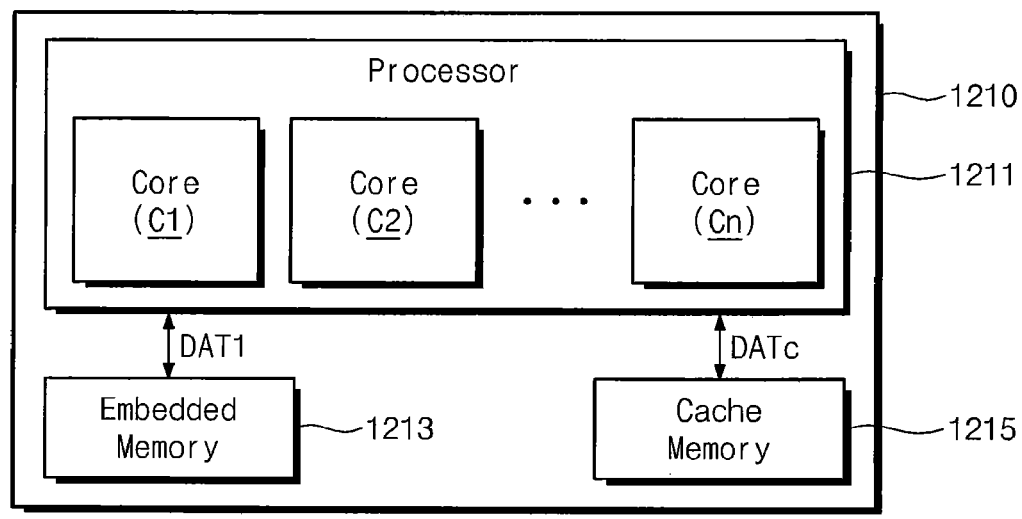
FIG. 11 is a schematic block diagram illustrating an electronic device including semiconductor devices according to example embodiments of the inventive concepts.

FIG. 11 is a schematic block diagram illustrating an electronic device including semiconductor devices according to example embodiments of the inventive concepts.

Referring to FIG. 11, an electronic device 1200 may include a semiconductor chip 1210. The semiconductor chip 1210 may include a processor 1211, an embedded memory 1213, and a cache memory 1215.

The processor 1211 may include one or more processor cores C1 to Cn. The one or more process cores C1 to Cn may process electrical data and electrical signals. The processor cores C1 to Cn may include a plurality of logic cells. In some embodiments, the logic cells may include semiconductor devices according to the above mentioned embodiments of the inventive concepts.

The electronic device 1200 may perform a specific function using the processed data and signals. For example, the processor 1211 may be an application processor.

The embedded memory 1213 may exchange first data DAT1 with the processor 1211. The first data DAT1 may be data processed or to be processed by the one or more processor cores C1 to Cn. The embedded memory 1213 may manage the first data DAT1. For example, the embedded memory 1213 may buffer the first data DAT1. In other words, the embedded memory 1213 may act as a buffer memory or working memory of the processor 1211.

In some embodiments, the electronic device 1200 may be applied to a wearable electronic device. The wearable electronic device may mainly perform functions requiring a relatively small quantity of operations. Thus, when the electronic device 1200 is applied to the wearable electronic device, the embedded memory 1213 may not have a large buffer capacity.

The embedded memory 1213 may be a SRAM. An operating speed of the SRAM may be faster than that of a DRAM. When the SRAM is embedded in the semiconductor chip 1210, it is possible to realize the electronic device 1200 having a small size and a fast operating speed. In addition, when the SRAM is embedded in the semiconductor chip 1210, consumption of an active power of the electronic device 1200 may be reduced. In some embodiments, the SRAM may include semiconductor devices according to the above mentioned embodiments of the inventive concepts.

The cache memory 1215 may be mounted on the semiconductor chip 1210 along with the one or more process cores C1 to Cn. The cache memory 1215 may store cache data DATc. The cache data DATc may be data used by the one or more process cores C1 to Cn. The cache memory 1215 may have a relatively small capacity but may have a very fast operating speed. For example, the cache memory 1215 may include a SRAM including semiconductor devices according to the above mentioned embodiments of the inventive concepts. When the cache memory 1215 is used, it is possible to reduce an accessing number and an accessing time of the processor 1211 with respect to the embedded memory 1213. Thus, the operating speed of the electronic device 1200 may be improved when the cache memory 1215 is used.

In FIG. 11, the cache memory 1215 is separated from the processor 1211 for the purpose of ease and convenience in explanation. However, in other embodiments, the cache memory 1215 may be configured to be included in the processor 1211. In other words, embodiments of the inventive concepts are not limited to the embodiment illustrated in FIG. 11.

The processor 1211, the embedded memory 1213, and the cache memory 1215 may transmit electrical data on the basis of at least one of various interface protocols. For example, the processor 1211, the embedded memory 1213, and the cache memory 1215 may transmit electrical data on the basis of at least one interface protocol of universal serial bus (USB), small computer system interface (SCSI), peripheral component interconnect (PCI) express, advanced technology attachment (ATA), parallel ATA (PATA), serial ATA (SATA), serial attached SCSI (SAS), integrated drive electronics (IDE), or universal flash storage (UFS).

Figure 12:
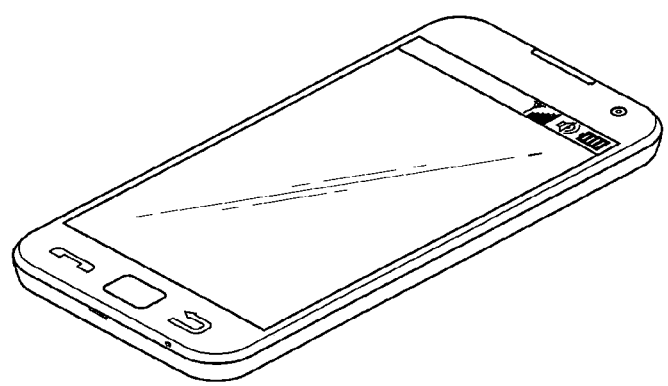
FIGS. 12 to 14 illustrate embodiments of multimedia devices including semiconductor devices according to example embodiments of the inventive concepts.
Figure 13:
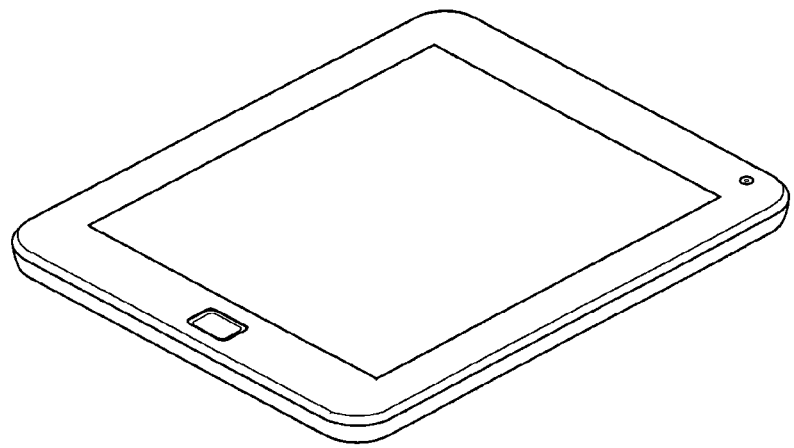
Figure 14:
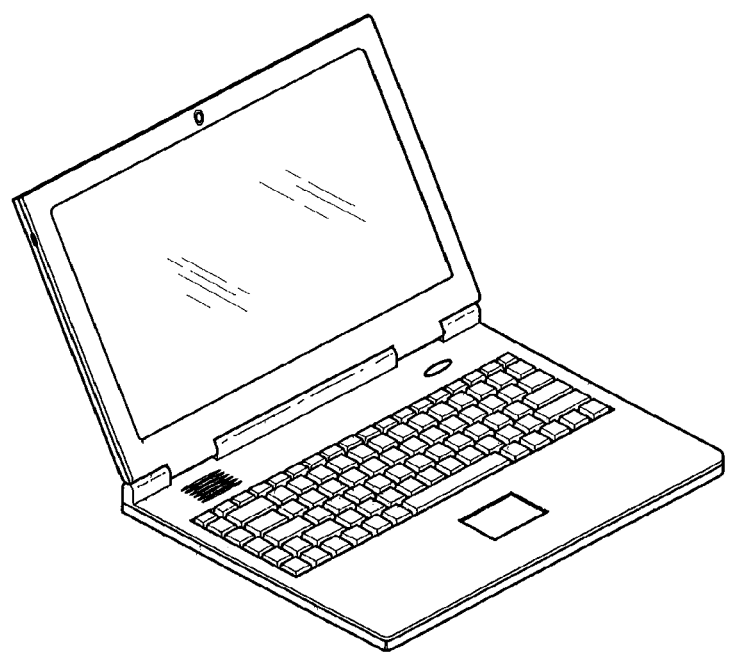

FIGS. 12 to 14 illustrate embodiments of multimedia devices including semiconductor devices according to example embodiments of the inventive concepts. The electronic system 1100 of FIG. 10 and/or the electronic device 1200 of FIG. 11 may be applied to a mobile or smart phone 2000 illustrated in FIG. 12, a tablet or smart table 3000 illustrated in FIG. 13, and/or a notebook computer 4000 illustrated in FIG. 14.

In semiconductor devices according to example embodiments of the inventive concepts, the enlarged active contact disposed on the source/drain region may be formed by less complex processes. Thus, the misalignment of the via on the active contact may be reduced or substantially prevented and the process margin may be improved. As such, the reliability of semiconductor devices may be improved. In addition, the contact area between the active contact and the via may be increased to reduce the resistance of semiconductor devices.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
   a substrate;
   a device isolation layer disposed on the substrate to define active patterns, the active patterns extending in a first direction and including upper portions protruding upwardly with respect to a top surface of the device isolation layer;
   a gate electrode on the upper portions of the active patterns, the gate electrode extending in a second direction intersecting the first direction;
   a first source/drain region disposed on the upper portion of a first one of the active patterns at one side of the gate electrode; and
   an active contact on the first source/drain region and electrically connected to the first source/drain region,
   wherein the active contact includes a first portion vertically overlapping with the first source/drain region, and a second portion extending from the first portion toward the device isolation layer, wherein the second portion is spaced apart from the device isolation layer and the first source/drain region with an insulating material interposed therebetween, and wherein a top surface of the first portion and a top surface of the second portion are coplanar with each other.

2. The semiconductor device of claim 1, wherein a bottom surface of the second portion is lower than a top surface of the gate electrode and higher than a bottom surface of the gate electrode on the device isolation layer.

3. The semiconductor device of claim 1, further comprising a second source/drain region disposed on the upper portion of a second one of the active patterns at one side of the gate electrode.

4. The semiconductor device of claim 3, wherein the first portion extends in the second direction on the first source/drain region, such that the second portion vertically overlaps with the device isolation layer between the first and second source/drain regions.

5. The semiconductor device of claim 1, further comprising a barrier layer covering the active contact, wherein the barrier layer covers outer surfaces of the first and second portions, except an interface between the first and second portions.

6. The semiconductor device of claim 1, wherein the second portion has a width in the second direction, and wherein the width of the second portion increases in a vertical direction away from the device isolation layer.

7. The semiconductor device of claim 1, further comprising a conductive connection pattern between the first source/drain region and the first portion, wherein the conductive connection pattern directly contacts the first source/drain region, and the first portion directly contacts the conductive connection pattern.

8. A semiconductor device comprising:

a substrate;

a device isolation layer disposed on the substrate to define a first active pattern and a second active pattern, the first and second active patterns extending in a first direction and including upper portions protruding upwardly with respect to a top surface of the device isolation layer;

a gate electrode on the upper portions of the first and second active patterns, the gate electrode extending in a second direction intersecting the first direction;

first and second source/drain regions disposed on the upper portions of the first and second active patterns, respectively, at one side of the gate electrode; and an active contact on the first source/drain region, wherein the active contact includes a first portion vertically overlapping with the first source/drain region, and a second portion extending from the first portion toward the device isolation layer, wherein the second portion is spaced apart from the device isolation layer, and wherein a level of a bottom surface of the active contact has a stepped profile that decreases from the first source/drain region toward the second source/drain region, reaches a lowest level, and then increases, but remains separated by an electrically insulating layer from the device isolation layer.

9. The semiconductor device of claim 8, wherein a bottom surface of the second portion is lower than a top surface of the gate electrode and higher than a bottom surface of the gate electrode on the device isolation layer.

10. The semiconductor device of claim 8, wherein the first portion extends in the second direction on the first source/drain region, such that the second portion vertically overlaps with the device isolation layer between the first and second source/drain regions.

11. The semiconductor device of claim 8, further comprising a barrier layer covering the active contact, wherein the barrier layer covers outer surfaces of the first and second portions, except an interface between the first and second portions.

12. The semiconductor device of claim 8, wherein the second portion has a width in the second direction, and wherein the width of the second portion increases in a vertical direction away from the device isolation layer.

13. The semiconductor device of claim 8, further comprising a conductive connection pattern between the first source/drain region and the first portion, wherein the conductive connection pattern directly contacts the first source/drain region, and the first portion directly contacts the conductive connection pattern.

14. A semiconductor device comprising:

a substrate;

a device isolation layer disposed on the substrate to define active patterns, the active patterns extending in a first direction and including upper portions protruding upwardly with respect to a top surface of the device isolation layer;

a gate electrode on the upper portions of the active patterns, the gate electrode extending in a second direction intersecting the first direction;

a first source/drain region disposed on the upper portion of a first one of the active patterns at one side of the gate electrode; and an active contact on the first source/drain region and electrically connected to the first source/drain region, an interlayer insulating layer covering at least a sidewall of the active contact; and a conductive line on the interlayer insulating layer and electrically connected to the active contact through a via, wherein the active contact includes a first portion vertically overlapping with the first source/drain region, and a second portion extending from the first portion toward the device isolation layer, wherein a top surface of the interlayer insulating layer, a top surface of the first portion and a top surface of the second portion are coplanar with each other, and wherein the via is on the top surface of the second portion, such that the via vertically overlaps with the device isolation layer under the second portion.

15. The semiconductor device of claim 14, wherein the second portion is spaced apart from the device isolation layer with an insulating material interposed therebetween.

16. The semiconductor device of claim 14, wherein a bottom surface of the second portion is lower than a top surface of the gate electrode and higher than a bottom surface of the gate electrode on the device isolation layer.

17. The semiconductor device of claim 14, further comprising a second source/drain region disposed on the upper portion of a second one of the active patterns at one side of the gate electrode.

18. The semiconductor device of claim 17, wherein the first portion extends in the second direction on the first source/drain region, such that the second portion vertically overlaps with the device isolation layer between the first and second source/drain regions.

19. The semiconductor device of claim 14, further comprising a barrier layer covering the active contact,
    wherein the barrier layer covers outer surfaces of the first and second portions, except an interface between the first and second portions.
20. The semiconductor device of claim 14, wherein the second portion has a width in the second direction, and
    wherein the width of the second portion increases in a vertical direction away from the device isolation layer.

* * * * *